United States Patent
Iwata et al.

(10) Patent No.: US 12,148,771 B2
(45) Date of Patent: Nov. 19, 2024

(54) PHOTOELECTRIC CONVERSION APPARATUS AND OPTICAL DETECTION SYSTEM

(71) Applicant: CANON KABUSHIKI KAISHA, Tokyo (JP)

(72) Inventors: Junji Iwata, Tokyo (JP); Yoshiyuki Hayashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 363 days.

(21) Appl. No.: 17/571,993

(22) Filed: Jan. 10, 2022

(65) Prior Publication Data

US 2022/0238573 A1 Jul. 28, 2022

(30) Foreign Application Priority Data

Jan. 22, 2021 (JP) ................................. 2021-008442

(51) Int. Cl.
*H01L 27/146* (2006.01)
*B60R 1/20* (2022.01)

(52) U.S. Cl.
CPC .. *H01L 27/14603* (2013.01); *H01L 27/14643* (2013.01); *B60R 1/20* (2022.01)

(58) Field of Classification Search
CPC ........ H01L 27/14603; H01L 27/14643; B60R 1/20
See application file for complete search history.

(56) References Cited

U.S. PATENT DOCUMENTS

| | | | |
|---|---|---|---|
| 2019/0103433 A1* | 4/2019 | Yamashita | H01L 27/14647 |
| 2019/0267414 A1* | 8/2019 | Otake | H01L 27/1461 |
| 2020/0203415 A1* | 6/2020 | Kobayashi | H01L 27/14636 |
| 2022/0238573 A1* | 7/2022 | Iwata | H01L 27/14643 |
| 2022/0336504 A1* | 10/2022 | Kitano | H01L 27/1461 |
| 2023/0063377 A1* | 3/2023 | Inoue | H01L 27/1464 |
| 2023/0246055 A1* | 8/2023 | Kobayashi | H01L 23/5225 257/447 |
| 2023/0299114 A1* | 9/2023 | Inoue | H01L 27/1446 257/431 |
| 2024/0038801 A1* | 2/2024 | Nakamura | H01L 27/14623 |
| 2024/0121530 A1* | 4/2024 | Kabe | H01L 27/14612 |

FOREIGN PATENT DOCUMENTS

| | | |
|---|---|---|
| JP | 2018088488 A | 6/2018 |
| JP | 2020021889 A | 2/2020 |
| JP | 2020057651 A | 4/2020 |
| WO | 2020179290 A1 | 9/2020 |

* cited by examiner

*Primary Examiner* — J. E. Schoenholtz
(74) *Attorney, Agent, or Firm* — Canon U.S.A., Inc. IP Division

(57) ABSTRACT

An apparatus includes a layer that has a light incident surface and includes elements, and a wiring structure. Each of the elements includes a photodiode. The photodiode includes first and second regions of first and second conductivity types. A voltage is supplied to the second region through a second-conductivity-type region. The wiring structure includes a first wiring positioned closest to the layer among wirings to supply the voltage to the second-conductivity-type region, a plug connecting the first wiring and the second-conductivity-type region, and a second wiring supplying a voltage to the first region. The second wiring covers the first region when viewed in plan, and a distance between the second wiring and the layer is shorter than a distance between the first wiring and the layer.

22 Claims, 24 Drawing Sheets

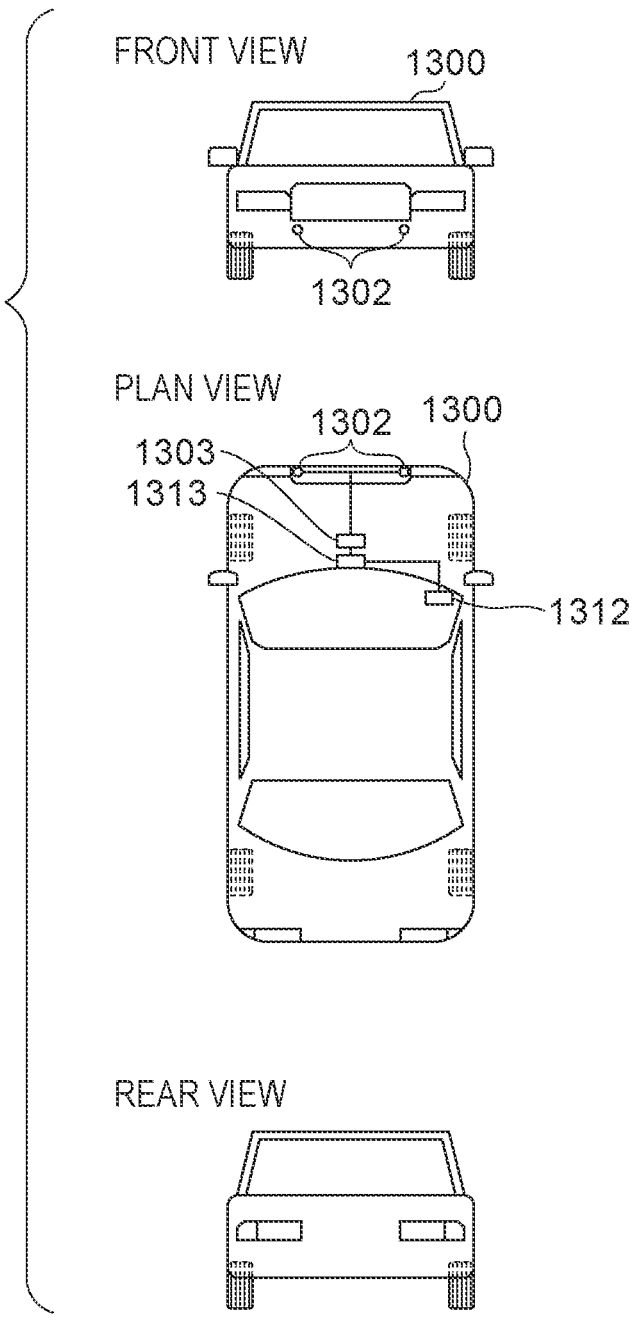

PHOTOELECTRIC CONVERSION APPARATUS AND OPTICAL DETECTION SYSTEM

BACKGROUND

Field of the Disclosure

The aspect of the embodiments relates to a photoelectric conversion apparatus performing photoelectric conversion and to an optical detection system.

Description of the Related Art

There is known a photoelectric conversion apparatus including a pixel array in which SPAD (Single Photon Avalanche Diode) pixels are formed in a planar pattern. In the SPAD pixels, a photocarrier attributable to a single photon causes avalanche multiplication in a PN junction region within a semiconductor region.

Japanese Patent Laid-Open No. 2018-88488 discloses, in relation to a photoelectric conversion apparatus including SPAD pixels, a first wiring supplying a potential to an N-type diffusion layer (cathode) of an avalanche photodiode (hereinafter abbreviated to an "APD"), and a second wiring supplying a potential to a P-type diffusion layer (anode) of the APD. In Japanese Patent Laid-Open No. 2018-88488, the first wiring and the second wiring are disposed on a surface of a substrate on an opposite side to a light incident surface of the substrate. The first wiring is disposed to cover an avalanche multiplication region.

The photoelectric conversion apparatus disclosed in Japanese Patent Laid-Open No. 2018-88488 has room for improvement regarding relationships between the first wiring and the second wiring, including configurations and placement positions of those wirings. For example, when pixels including the avalanche photodiodes are used, a withstand voltage is to be ensured in consideration of the difference between a voltage applied to the cathode and a voltage applied to the anode. In Japanese Patent Laid-Open No. 2018-88488, however, relationships between a first metal wiring supplying a potential to the cathode and a second metal wiring supplying a potential to the anode, including configurations and placement positions of those metal wirings, are not explained in consideration of the withstand voltage.

SUMMARY OF THE DISCLOSURE

According to one aspect, the present disclosure provides an apparatus including a layer that has a light incident surface and includes conversion elements, and a wiring structure disposed on a surface of the layer on an opposite side to the light incident surface, wherein each of the conversion elements includes a photodiode, the photodiode includes a first region of a first conductivity type in which charges having the same polarity as signal carriers are majority carriers and a second region of a second conductivity type, a voltage is supplied to the second region through a region of the second conductivity type, the wiring structure includes a first wiring positioned closest to the layer among wirings to supply the voltage to the region of the second conductivity type, a plug arranged to connect the first wiring and the region of the second conductivity type, and a second wiring arranged to supply a voltage to the first region, the second wiring is disposed to cover the first region when viewed in plan, and a distance between the second wiring and the layer is shorter than a distance between the first wiring and the layer.

According to another aspect, the present disclosure provides a apparatus including a layer that has a light incident surface and includes conversion elements, and a wiring structure disposed on a surface of the layer on an opposite side to the light incident surface, wherein each of the conversion elements includes a photodiode; the photodiode includes a first region of a first conductivity type in which charges having the same polarity as signal carriers are majority carriers and a second region of a second conductivity type; a voltage is supplied to the second region through a region of the second conductivity type; the wiring structure includes a first wiring positioned closest to the layer among wirings to supply the voltage to the region of the second conductivity type, a plug arranged to connect the first wiring and the region of the second conductivity type, and a second wiring disposed to overlap the first region when viewed in plan; the second wiring is disposed to cover the first region when viewed in plan; a distance between the second wiring and the layer is shorter than a distance between the first wiring and the layer; when viewed in plan, a first conversion element among the conversion elements and a second conversion element among the conversion elements are disposed side by side in a first direction, and a third conversion element among the conversion elements and the second conversion element among the conversion elements are disposed side by side in a second direction intersecting the first direction; and when viewed in plan, the second wiring overlapping the first region of the first conversion element when viewed in plan and the second wiring overlapping the first region of the second conversion element are disposed adjacent to each other in the first direction, and the first wiring is not disposed between the second wiring for the first conversion element when viewed in plan and the second wiring for the second conversion element.

According to still another aspect, the present disclosure provides an apparatus including a layer that has a light incident surface and includes conversion elements including photodiodes, and a wiring structure disposed on a surface of the layer on an opposite side to the light incident surface, wherein each of the photodiodes includes a first region of a first conductivity type in which charges having the same polarity as signal carriers are majority carriers and a second region of a second conductivity type, a voltage is supplied to the second region through a region of the second conductivity type, the wiring structure includes a first wiring arranged to supply the drive voltage to the region of the second conductivity type and positioned closest to the layer, and a second wiring disposed in the same wiring layer as the first wiring and arranged to supply a drive voltage to the first region, the first wiring has an opening, the second wiring is disposed in the opening of the first wiring when viewed in plan, the second wiring is formed by five or more sides when viewed in plan, and the opening of the first wiring has five or more sides.

Further features of the disclosure will become apparent from the following description of exemplary embodiments with reference to the attached drawings.

BRIEF DESCRIPTION OF THE DRAWINGS

FIGS. 21A and 21B are a block diagram and a layout view, respectively, of an optical detection system according to an eleventh embodiment.

DESCRIPTION OF THE EMBODIMENTS

Figure 1:
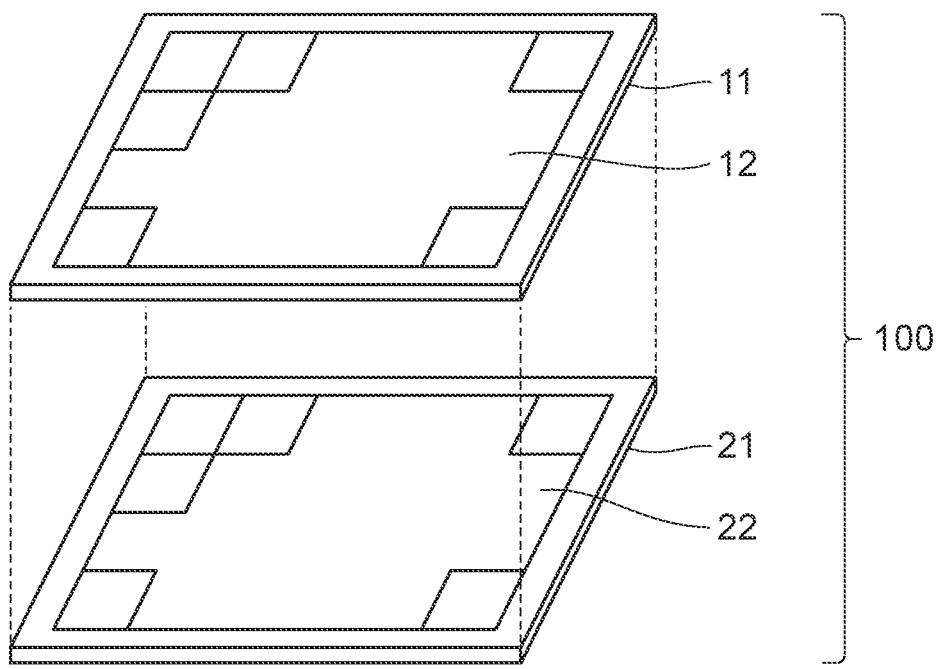
FIG. 1 illustrates a configuration of a photoelectric conversion apparatus.

Embodiments described below represent examples of implementing the technical concept of the present disclosure and are not purported to limit the present disclosure. Sizes and positional relationships illustrated in the drawings are exaggerated in some cases for clearer understanding of explanation. In the following, the same components are denoted by the same reference numerals and description of those components is omitted in some cases.

Configurations common to photoelectric conversion apparatuses according to the embodiments are described with reference to FIGS. 1 to 4.

Each of the photoelectric conversion apparatuses includes SPAD pixels including avalanche photodiodes. A conductivity type of electric charges of charge pairs generated in the avalanche photodiodes, the electric charges being used as signal carriers, is called a first conductivity type. The first conductivity type indicates the conductivity type of majority carriers having the same polarity as the signal carriers. The conductivity type opposite to the first conductivity type is called a second conductivity type. In an example described below, it is assumed that the signal carriers are electrons, the first conductivity type is N type, and the second conductivity type is P type. However, the signal carriers may be holes, the first conductivity type may be P type, and the second conductivity type may be N type.

In this Specification, when the term "impurity concentration" is simply used, it indicates a net impurity concentration obtained by subtracting a concentration compensated by the impurity of the opposite conductivity type. Thus, the term "impurity concentration" indicates a NET doping concentration. The region where a concentration of a P-type dopant impurity is higher than that of an N-type dopant impurity is a P-type semiconductor region. On the contrary, the region where a concentration of the N-type dopant impurity is higher than that of the P-type dopant impurities is an N-type semiconductor region.

In this Specification, the wording "when viewed in plan" indicates that a semiconductor substrate (described later) is viewed in a direction perpendicular to a light incident surface. The wording "cross-section" indicates a surface along a cut line when a sensor substrate 11 is cut in a direction perpendicular to a light incident surface of a semiconductor layer 302 of the sensor substrate 11. When the light incident surface of the semiconductor layer is a rough surface in a microscopic view, the direction "when viewed in plan" is defined on the basis of the light incident surface of the semiconductor layer in a macroscopic view.

In this Specification, the wording "depth direction" indicates a direction from the light incident surface (first surface) of the semiconductor layer 302 toward a surface (second surface) on a side where a circuit substrate 21 is disposed.

The configurations common to the embodiments are first described.

FIG. 1 illustrates a configuration of a multilayer photoelectric conversion apparatus 100 according to an embodiment of the present disclosure.

The photoelectric conversion apparatus 100 is constituted by stacking two substrates, namely the sensor substrate 11 and the circuit substrate 21, and by electrically connecting those two substrates. The sensor substrate 11 includes a first semiconductor layer including a photoelectric conversion element 102 (described later), and a first wiring structure. The circuit substrate 21 includes a second semiconductor layer including circuits such as signal processing sections 103 (described later), and a second wiring structure. The photoelectric conversion apparatus 100 is formed by laminating the second semiconductor layer, the second wiring structure, the first wiring structure, and the first semiconductor layer. The photoelectric conversion apparatus according to the embodiments are each a backside-illuminated photoelectric conversion apparatus in which light is incident on the first surface and the circuit substrate is disposed on the second surface.

Although, in the following, the sensor substrate 11 and the circuit substrate 21 are described as being in the form of chips after dicing, those substrates are each not limited to a chip. For example, each substrate may be a wafer. Alternatively, the substrates may be obtained by stacking wafers and then dicing the wafers into chips, or by dicing wafers into chips and then stacking and joining the chips.

A pixel region 12 is formed in the sensor substrate 11, and a circuit region 22 where signals detected in the pixel region 12 are processed is formed in the circuit substrate 21.

Figure 2:
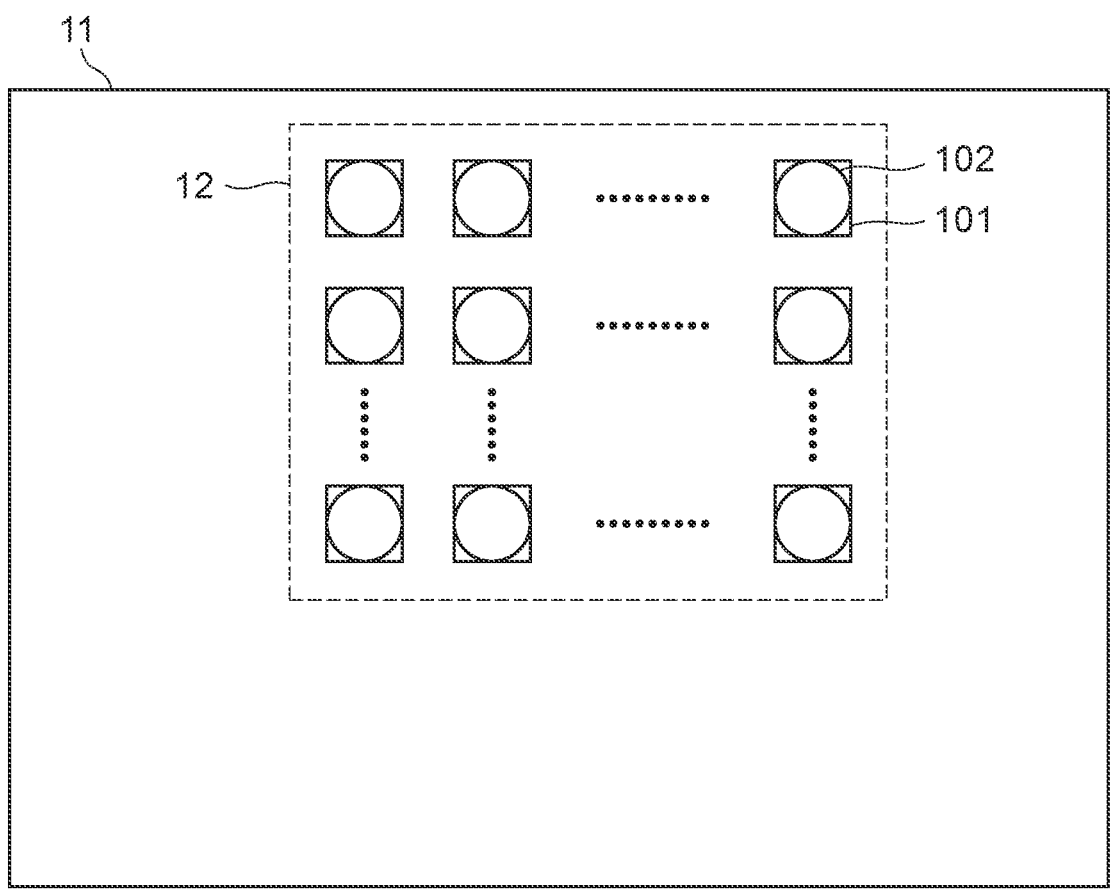
FIG. 2 illustrates a layout example on a sensor substrate.

FIG. 2 illustrates a layout example on the sensor substrate 11. Pixels 101 including the photoelectric conversion elements 102 each of which includes an avalanche photodiode (APD) 201 (see FIG. 4) are arranged in a two-dimensional array when viewed in plan, thus forming the pixel region 12.

The pixels 101 are typically pixels for forming an image but are not always required to form an image when the pixels are used in TOF (Time of Flight) systems. In other words, the pixels 101 may be each a pixel for measuring a time at which light arrives and an amount of the light.

Figure 3:
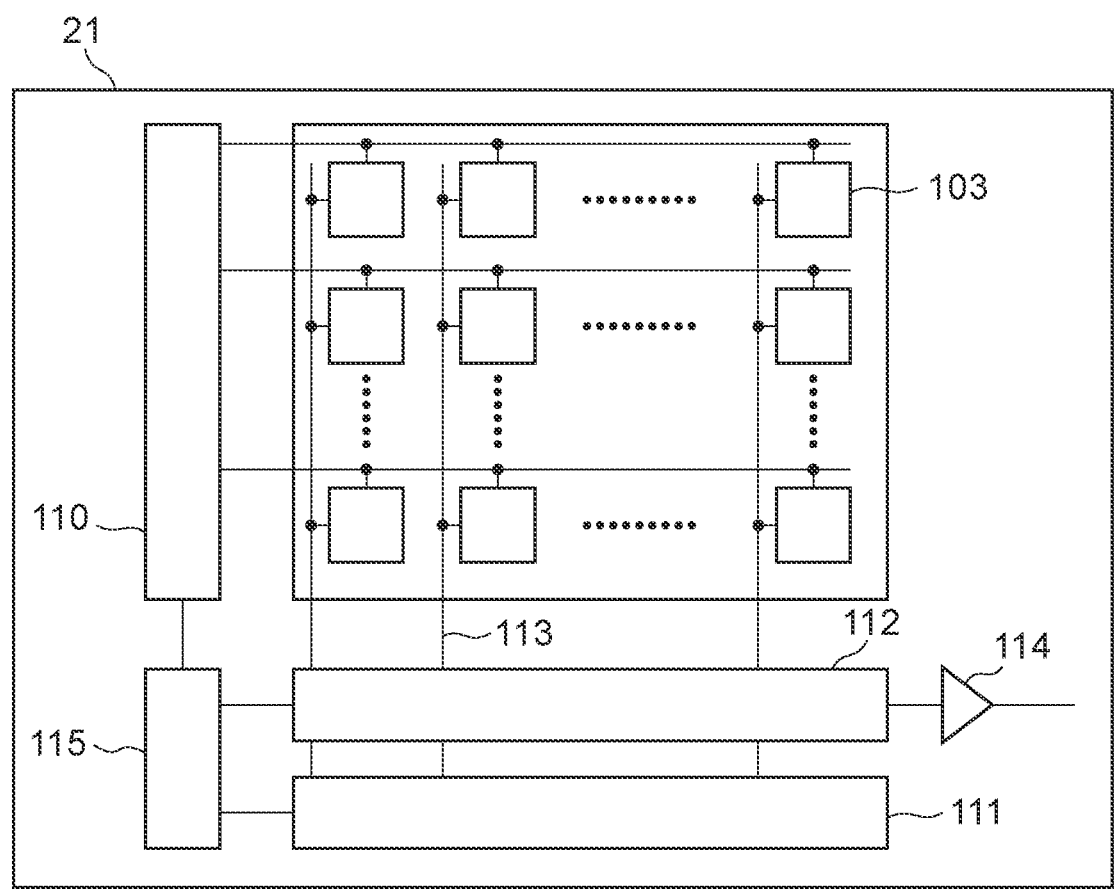
FIG. 3 illustrates a layout example on a circuit substrate.

FIG. 3 illustrates a layout example on the circuit substrate 21. The circuit substrate 21 includes the signal processing sections 103 for processing electric charges after being photoelectrically converted in the photoelectric conversion elements 102 in FIG. 2, a column circuit 112, a control pulse generation section 115, a horizontal scanning circuit section 111, output lines 113, and a vertical scanning circuit section 110.

The photoelectric conversion elements 102 in FIG. 2 and the signal processing sections 103 in FIG. 3 are electrically connected via connection wirings that are disposed per pixel.

The vertical scanning circuit section 110 receives control pulses supplied from the control pulse generation section 115 and supplies the control pulses to the individual pixels. Logic circuits, such as a shift register and an address decoder, are used in the vertical scanning circuit section 110.

Signals output from the photoelectric conversion elements 102 in the pixels are processed in the signal processing sections 103. A counter, a memory, and so on are disposed in each of the signal processing sections 103, and a digital value is held in the memory.

To read out digital signals from the memories of the pixels in which the digital signals are held, the horizontal scanning circuit section 111 inputs, to the signal processing sections 103, control pulses for sequentially selecting each column.

With respect to selected one of the columns, a signal is output from the signal processing section 103 in the pixel selected by the vertical scanning circuit section 110 to the output line 113.

The signal output to the output line 113 is in turn output to a recording unit or a signal processing unit outside the photoelectric conversion apparatus 100 through an output circuit 114.

In FIG. 2, the photoelectric conversion elements may be one-dimensionally arrayed in the pixel region. Beneficial effects of the present disclosure can be obtained even in the case of using one pixel, and an advantageous effect resulting from ensuring a withstand voltage in this embodiment is easy to more effectively obtain with a photoelectric conversion apparatus including multiple pixels. The function of the signal processing section is not always required to be disposed one for each of all the photoelectric conversion elements. For example, one signal processing section may be shared by multiple photoelectric conversion elements, and the signal processing may be executed sequentially.

As illustrated in FIGS. 2 and 3, the signal processing sections 103 are disposed in a region overlapping the pixel region 12 when viewed in plan. Furthermore, the vertical scanning circuit section 110, the horizontal scanning circuit section 111, the column circuit 112, the output circuit 114, and the control pulse generation section 115 are disposed to overlap regions between edges of the sensor substrate 11 and edges of the pixel region 12 when viewed in plan. In other words, the sensor substrate 11 has the pixel region 12 and a non-pixel region positioned around the pixel region 12, and the vertical scanning circuit section 110, the horizontal scanning circuit section 111, the column circuit 112, the output circuit 114, and the control pulse generation section 115 are disposed in regions overlapping the non-pixel region when viewed in plan.

Figure 4:
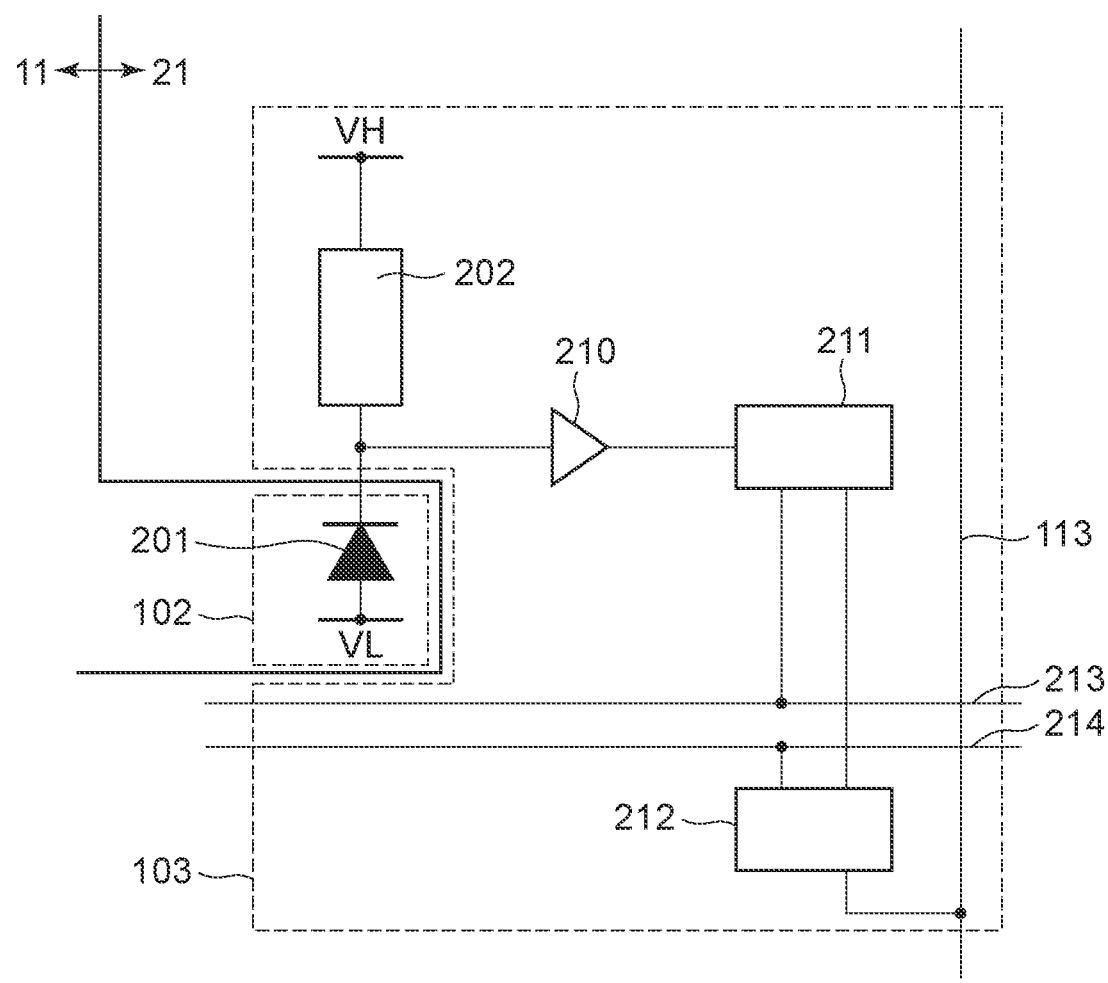
FIG. 4 is a block diagram including an equivalent circuit of a photoelectric conversion element.

FIG. 4 illustrates an example of a block diagram including equivalent circuits of FIGS. 2 and 3.

In FIG. 2, the photoelectric conversion elements 102 each including the APD 201 are disposed in the sensor substrate 11, and other members are disposed in the circuit substrate 21.

The APD 201 generates charge pairs through photoelectric conversion in accordance with incident light. A voltage VL (first voltage) is supplied to an anode of the APD 201. A voltage VH (second voltage) higher than the voltage VL supplied to the anode is supplied to a cathode of the APD 201. A reverse bias voltage is supplied between the anode and the cathode such that the APD 201 is operated to perform avalanche multiplication. By maintaining the state in which the above-mentioned voltages are supplied, electric charges generated due to the incident light cause the avalanche multiplication, and an avalanche current is generated.

When the reverse bias voltage is supplied, there are a Geiger mode in which the APD 201 is operated under condition of a potential difference between the anode and the cathode being higher than a breakdown voltage, and a linear mode in which the APD 201 is operated under condition of the potential difference between the anode and the cathode being close to or lower than the breakdown voltage.

The APD operated in the Geiger mode is called an SPAD. For example, the voltage VL (first voltage) is −30 V, and the voltage VH (second voltage) is 1 V. The APD 201 may be operated in the linear mode or the Geiger mode. In the case of the SPAD, the potential difference is greater than in the case of the APD operated in the linear mode, and an effect resulting from increasing the withstand voltage is more significant. For that reason, in one embodiment, the APD is the SPAD.

A quenching element 202 is connected to a power supply for supplying the voltage VH and to the APD 201. The quenching element 202 functions as a load circuit (quenching circuit) when signal multiplication is caused due to the avalanche multiplication and has a role of suppressing the voltage supplied to the APD 201, thereby suppressing the avalanche multiplication (called a quenching operation). In addition, the quenching element 202 has a role of supplying a current in an amount corresponding to a voltage drop caused by the quenching operation and returning the voltage supplied to the APD 201 to the voltage VH (called a recharge operation).

The signal processing section 103 includes a waveform shaping section 210, a counter circuit 211, and a selection circuit 212. In this Specification, the signal processing section 103 may include any one or more of the waveform shaping section 210, the counter circuit 211, and the selection circuit 212.

The waveform shaping section 210 shapes a potential change obtained at the cathode of the APD 201 in detection of photons and outputs a pulse signal. For example, an inverter circuit is used as the waveform shaping section 210. FIG. 4 illustrates an example in which one inverter is used as the waveform shaping section 210. However, the waveform shaping section 210 may be constituted by a circuit including multiple inverters connected in series, or by another circuit with a waveform shaping effect.

The counter circuit 211 counts pulse signals output from the waveform shaping section 210 and holds a count value.

Moreover, when a control pulse pRES is supplied via a drive line 213, the signal held in the counter circuit 211 is reset.

A control pulse pSEL is supplied to the selection circuit 212 from the vertical scanning circuit section 110 in FIG. 3 via a drive line 214 in FIG. 4 (the drive line 214 being not illustrated in FIG. 3), thereby switching electrical connection and disconnection between the counter circuit 211 and the output line 113. The selection circuit 212 includes, for example, a buffer circuit for outputting a signal.

A switch, such as a transistor, may be disposed between the quenching element 202 and the APD 201 or between the photoelectric conversion element 102 and the signal processing section 103 to switch electrical connection therebetween. Similarly, the supply of the voltage VH or the voltage VL to the photoelectric conversion element 102 may be electrically switched by using a switch such as a transistor.

The configuration using the counter circuit 211 is adopted in this embodiment. However, a TDC (Time to Digital Converter) and a memory may be used instead of the counter circuit 211 to constitute the photoelectric conversion apparatus 100 that is to measure timing of pulse detection. In such a case, generation timing of the pulse signal output from the waveform shaping section 210 is converted to a digital signal by the TDC. For measuring the timing of the pulse signal, a control pulse pREF (reference signal) is supplied to the TDC from the vertical scanning circuit section 110 in FIG. 3 via a drive line. The TDC obtains, as a digital signal, a signal representing a relative time of the input timing of the signal output from each pixel through the waveform shaping section 210 with the control pulse pREF being a reference.

Figure 5A:
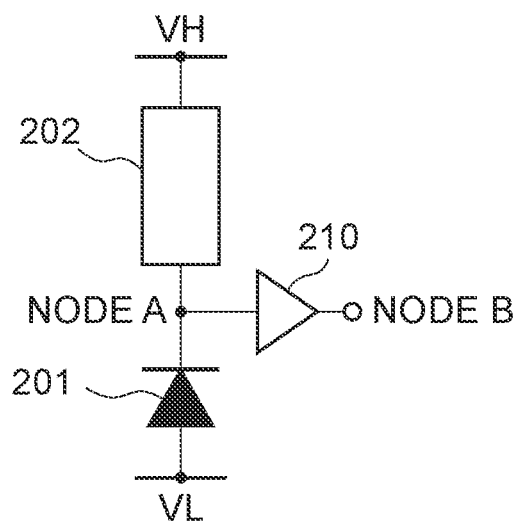
FIGS. 5A, 5B and 5C illustrate relationships between operation of an APD and output signals.
Figure 5B:
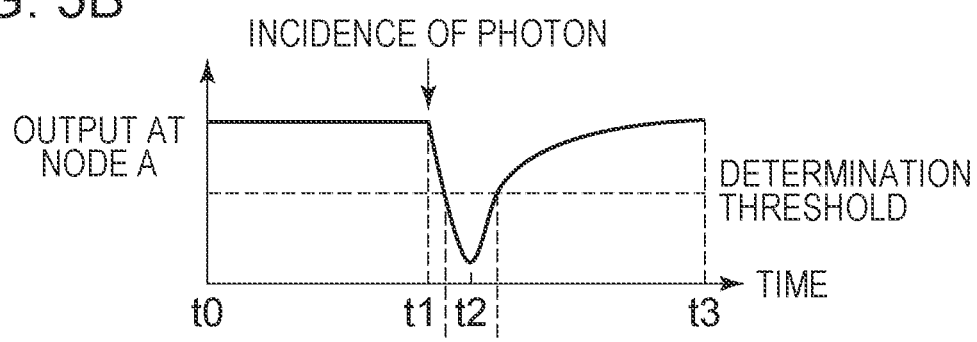
Figure 5C:
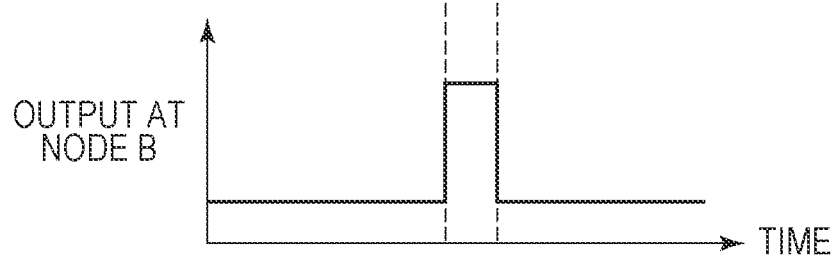

FIGS. 5A, 5B and 5C illustrate relationships between operation of the APD and output signals.

FIG. 5A illustrates the APD 201, the quenching element 202, and the waveform shaping section 210 that are extracted from FIG. 4. Here, an input side of the waveform shaping section 210 is indicated by a node A, and an output side is indicated by a node B. FIG. 5B represents a waveform change at the node A in FIG. 5A, and FIG. 5C represents a waveform change at the node B in FIG. 5A.

During a period from time t0 to time t1, the potential difference of VH−VL is applied to the APD 201 in FIG. 5A. When a photon is incident on the APD 201 at the time t1, the avalanche multiplication generates in the APD 201, and an avalanche multiplication current flows through the quenching element 202, whereby a voltage at the node A drops. When an amount of the voltage drop further increases and the potential difference applied to the APD 201 reduces, the avalanche multiplication in the APD 201 is stopped as indicated at the time t2, and a voltage level at the node A does not further drop beyond a certain value. Thereafter, a current compensating for the voltage drop flows to the node A from the voltage VL during a period from the time t2 to time t3. At the time t3, the potential level at the node A is settled down to an initial level. On that occasion, part of an output waveform at the node A, the part exceeding a certain threshold, is shaped by the waveform shaping section 210 and is output as a signal through the node B.

The layout of the output lines 113, the column circuit 112, and the output circuit 114 is not limited to that illustrated in FIG. 3. For example, the output lines 113 may be disposed to extend in a row direction, and the column circuit 112 may be disposed at extended ends of the output lines 113.

Photoelectric conversion apparatuses according to various embodiments will be described below.

First Embodiment

Figure 6:
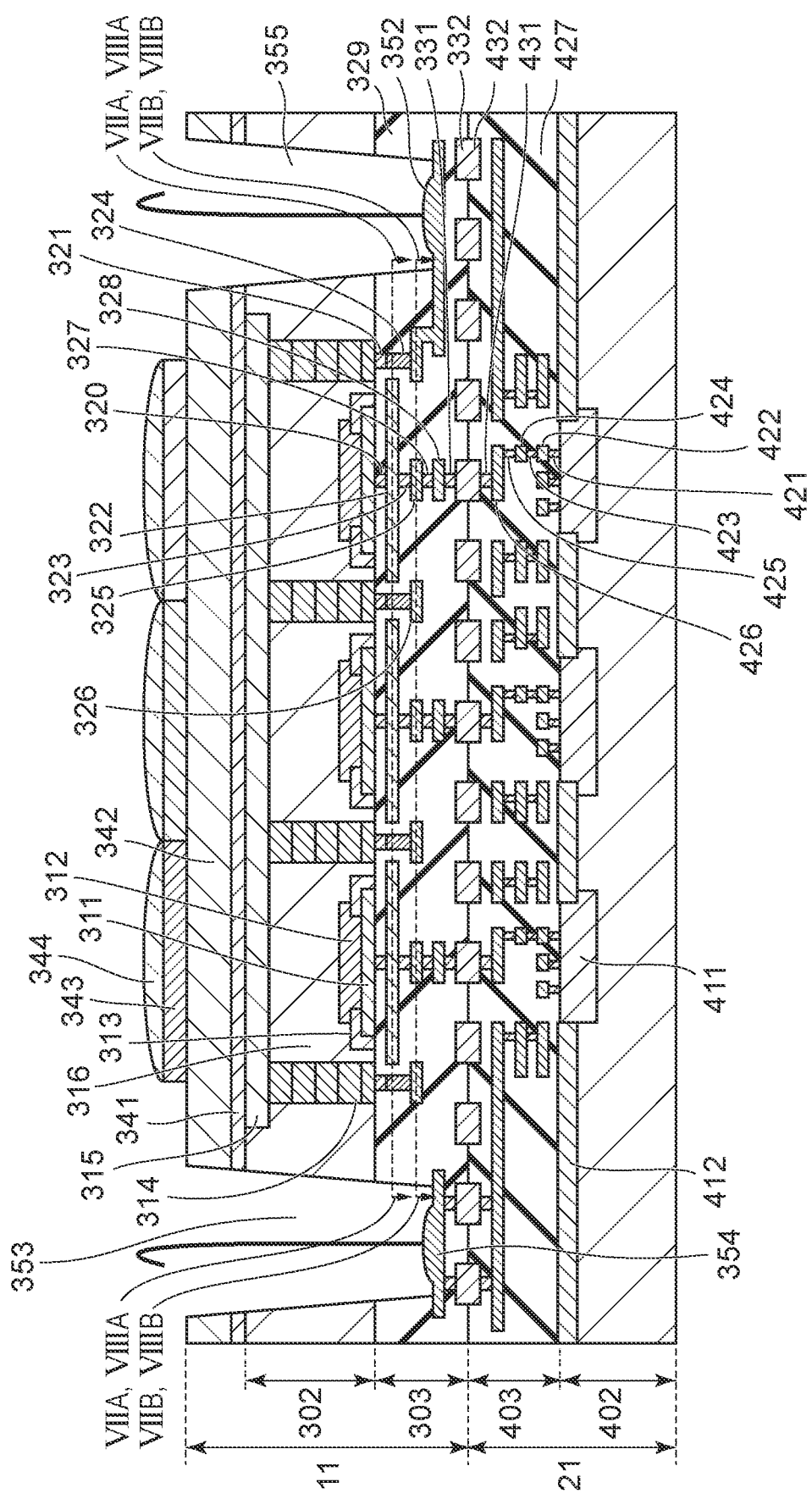
FIG. 6 is a schematic sectional view of a photoelectric conversion apparatus according to a first embodiment.
Figure 7A:
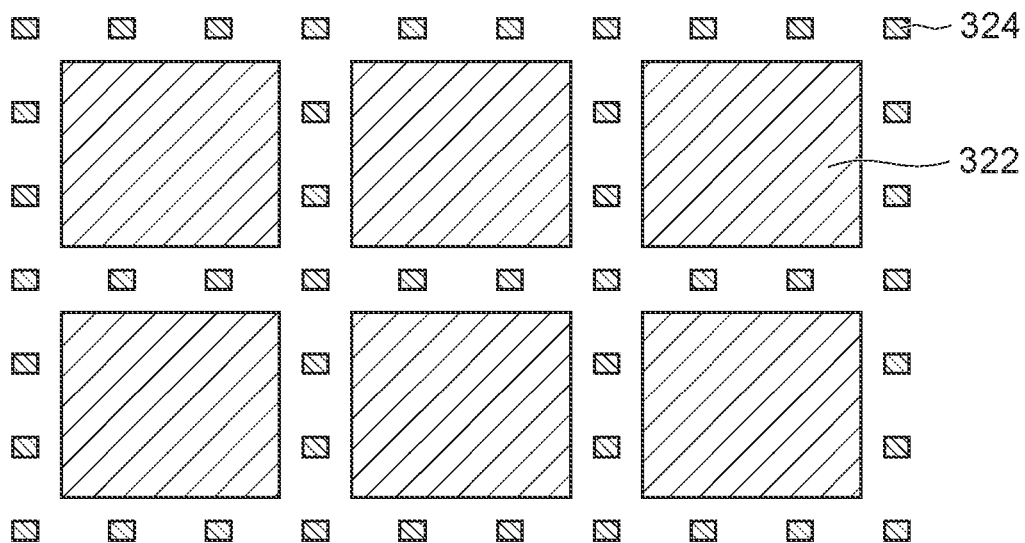
FIGS. 7A and 7B are schematic plan views of the photoelectric conversion apparatus according to the first embodiment.
Figure 7B:
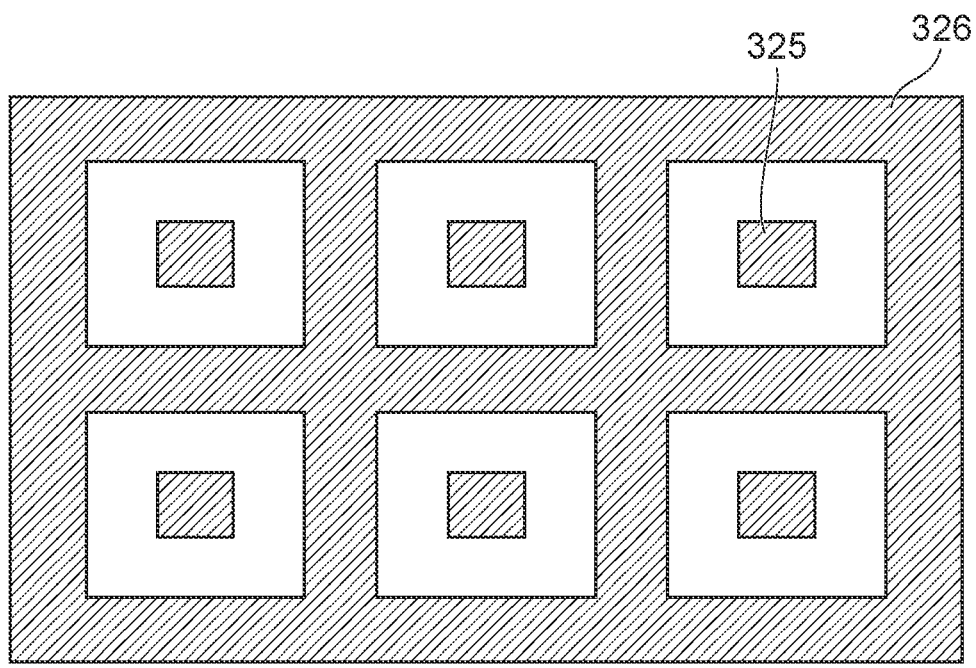
Figure 8A:
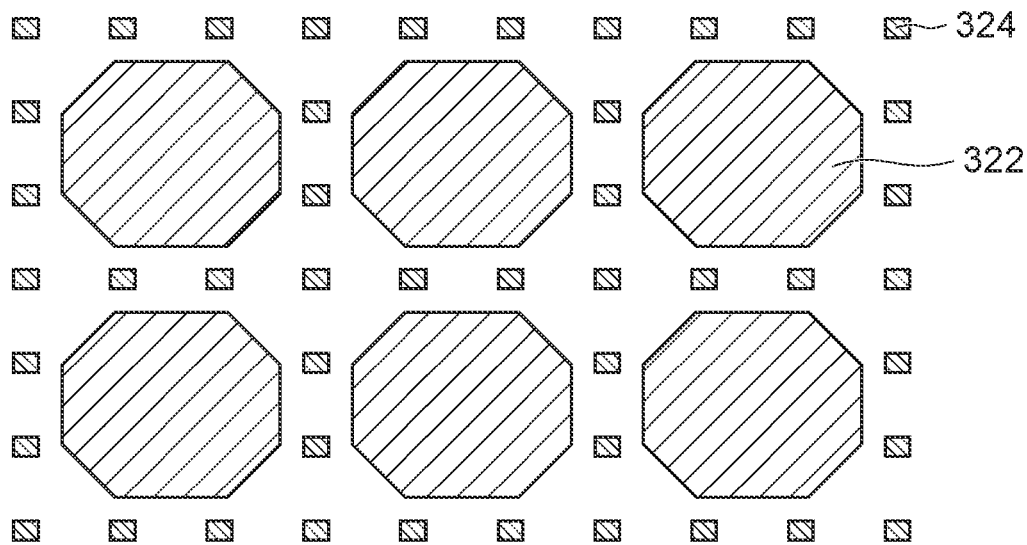
FIGS. 8A and 8B are schematic plan views of a photoelectric conversion apparatus according to a modification of the first embodiment.
Figure 8B:
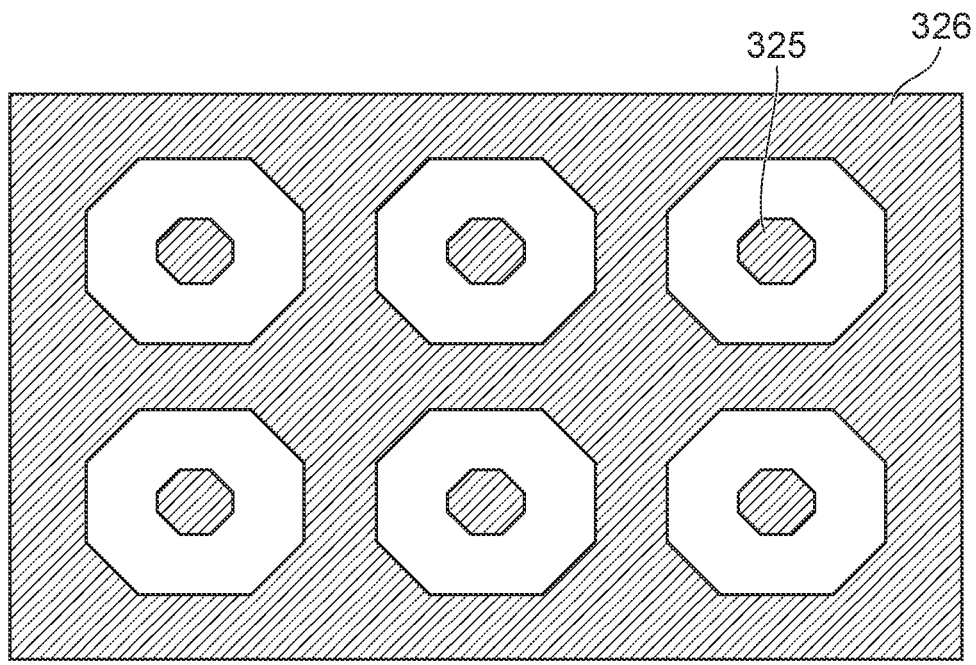

FIG. 6 is a schematic sectional view of an SPAD pixel in a first embodiment. FIGS. 7A and 7B are schematic plan views taken along VIIA-VIIA and VIIB-VIIB in FIG. 6, respectively. FIGS. 8A and 8B are schematic plan views taken along VIIIA-VIIIA and VIIIB-VIIIB, in FIG. 6, respectively.

As illustrated in FIG. 6, the circuit substrate 21 and the sensor substrate 11 are stacked. The circuit substrate 21 includes a semiconductor layer 402 including circuit elements that form a signal processing circuit, and a wiring structure 403. The sensor substrate 11 includes a semiconductor layer 302 in which the APDs are disposed, and a wiring structure 303. The semiconductor layer 302, the wiring structure 303, the wiring structure 403, and the semiconductor layer 402 are disposed in order from a side closer to a light incident surface. In the photoelectric conversion apparatus, the wiring structure 403 of the circuit substrate 21 and the wiring structure 303 of the sensor substrate 11 are bonded in contact with each other. In a specific example, a wiring 332 included in the wiring structure 303 and a wiring 432 included in the wiring structure 403 are bonded. In other words, a wiring layer in which the wiring 332 is disposed and a wiring layer in which the wiring 432 is disposed are bonded. Thus, the wiring 332 and the wiring 432 form metal bonded portions. As described later, the metal bonded portions include a metal bonded portion that is electrically connected to the semiconductor layer 302 and the semiconductor layer 402, and a metal bonded portion that is not connected to the semiconductor layer 302 and the semiconductor layer 402.

Here, the wording "wiring layer" indicates one of multiple wiring layers forming the wiring structure 303. The word "wiring" indicates a specific one of wirings disposed in the layers to which a specific potential is supplied. An interlayer insulating film 329 or 427 is disposed between the wirings.

The semiconductor layer 302 of the sensor substrate 11 includes the APDs. Each of the APDs includes a first semiconductor region 311 of the first conductivity type and a second semiconductor region 312 of the second conductivity type. The first semiconductor region 311 and the second semiconductor region 312 form a PN junction. In an end portion of the PN junction forming the APD, a third semiconductor region 313 of the first conductivity type may be formed to relax an electric field. In just aiming to relax the electric field, the third semiconductor region 313 may be formed of a semiconductor region of the second conductivity type. An impurity concentration in the third semiconductor region 313 is lower than in the first semiconductor region 311 when the third semiconductor region 313 is of the first conductivity type, and is lower than in the second semiconductor region 312 when it is of the second conductivity type.

A difference in impurity concentration between the third semiconductor region 313 and the first semiconductor region 311 or a difference in impurity concentration between the third semiconductor region 313 and the second semiconductor region 312 is twice or more.

A thickness of the semiconductor layer 302 can be set as appropriate depending on a wavelength of light to be detected. A color of the light to be detected by the photoelectric conversion apparatus can be set to, for example, blue, green, red, or a color of infrared light according to the purpose. A peak wavelength of the light to be detected by the photoelectric conversion apparatus can be set in a range of, for example, 350 nm or longer to 1000 nm or shorter. A reflective metal layer 322 can reflect light having passed through the semiconductor layer 302. Therefore, this embodiment is easy to further improve sensitivity especially for long-wavelength light such as infrared light.

The adjacent APDs are separated by a fourth semiconductor region 314 of the second conductivity type. A fifth semiconductor region 315 of the second conductivity type is disposed on a side closer to the light incident surface. A sixth semiconductor region 316 of the second conductivity type is disposed between the second semiconductor region 312 and the fifth semiconductor region 315.

A concentration of an impurity of the second conductivity type in the sixth semiconductor region 316 in a zone overlapping the first semiconductor region 311 when viewed in plan may be higher than that of the impurity of the second conductivity type in the sixth semiconductor region 316 in a zone not overlapping the first semiconductor region 311 when viewed in plan.

A pinning film 341 for suppressing a dark current may be disposed at an interface defined by the light incident surface. A known material can be used for the pinning film 341. A planarization layer 342, a filter layer 343, and microlenses 344 are disposed on a surface of the pinning film 341 on a side closer to the light incident surface. Various optical filters, such as a color filter, an infrared cut filter, and a monochromatic filter, can be optionally used as the filter layer 343. For example, an RGB color filter or an RGBW color filter can be used as the color filter.

Drive voltages are applied to the anode and the cathode of the APD. Voltages enabling a reverse bias to be applied to the APD are applied as the drive voltages. Of the drive voltages, the voltage with a higher absolute value is applied to one of the anode and the cathode of the APD through a pad electrode 352 that is disposed in a pad opening 355. Of the drive voltages, the other voltage with a lower absolute value is applied to the other one of the anode and the cathode of the APD through a pad electrode 354 that is disposed in a pad opening 353. In FIG. 6, the voltage applied through the pad electrode 352 is applied to the anode of the APD, and the voltage applied through the pad electrode 354 is applied to the cathode of the APD.

Maximum diameters of the pad openings 353 and 355 are each set to, for example, 50 μm or greater in one embodiment, and in another embodiment, for example, 80 μm or greater. Depths of the pad openings 353 and 355 are each set to, for example, 1 μm or greater and 30 μm or smaller and in one embodiment, for example, 3 μm or greater and 8 μm or smaller.

Of the drive voltages, the voltage with the higher absolute value is applied to the anode through a via 324. In a specific example, that voltage is applied to the fourth semiconductor region 314 through a wiring 326 (e.g., first wiring), the via 324, and a contact plug 321 that is connected to the anode of the APD. The wiring 326, the via 324, and the contact plug 321 are each held at the same potential as the anode of the APD. The wiring 326 is one of wirings for supplying the drive voltage to the fourth semiconductor region 314, the one wiring being closest to the semiconductor layer 302.

Of the drive voltages for the APD, the voltage with the lower absolute value is supplied to the circuit substrate 21 through the pad electrode 354, a via 331 connected to the wiring 332, and the wiring 332. Thus, that drive voltage is supplied to the cathode through the circuit substrate 21.

The signal carriers avalanche-multiplied in the PN junction are supplied to the circuit substrate 21 through a contact plug 320, the reflective metal layer 322, a via 323, a wiring 325, a via 327, a wiring 328, a via 331 connected to the wiring 332, and the wiring 332. When the avalanche-multiplied electric charges are read out, the contact plug 320, the reflective metal layer 322, the via 323, the wiring 325, the via 327, the wiring 328, the via 331 connected to the wiring 332, and the wiring 332 are held at the same potential as the cathode of the APD.

The reflective metal layer 322 reflects the light having passed through the semiconductor layer 302. The reflective metal layer 322 (e.g., second wiring) is disposed to cover an avalanche multiplication region when viewed in plan. In one embodiment, the reflective metal layer 322 is disposed to cover the entirety of the avalanche multiplication region when viewed in plan. Furthermore, the reflective metal layer 322 is disposed to cover the entirety of the first semiconductor region 311 when viewed in plan. The reflective metal layer 322 is formed in one of the wiring layers in the wiring structure, the one wiring layer being positioned closest to the semiconductor layer 302. For example, long-wavelength light that has not been fully absorbed by the semiconductor layer 302 can be reflected by the reflective metal layer 322 to enter the semiconductor layer 302 again. This improves sensitivity for the long-wavelength light that is not fully absorbable by the semiconductor layer 302.

In another embodiment, a material of the reflective metal layer 322 is selected so as to maximize reflectance at a wavelength of light to be reflected. For example, copper or aluminum can be used as the material of the reflective metal layer 322. When copper is used, reflectance for infrared light can be increased in comparison with the case of using aluminum. Here, the wording "copper is used" indicates that copper is used as a main component, and the reflective metal layer 322 is not required to be made of only copper. The main component indicates a material that is contained more than 50% of all materials of the reflective metal layer 322. When aluminum is used, the wording "aluminum is used" similarly indicates that aluminum is a main component.

The pad electrode 352 may be made of aluminum, and the other wirings may be all made of copper.

The reflective metal layer 322 may be made of a material different from that of the wiring 326.

As an area of the reflective metal layer 322 increases, an amount of reflected light can be increased with respect to that of incident light. Therefore, the reflective metal layer 322 is formed in an area as large as possible. One of the two drive voltages for the APD is applied to the reflective metal layer 322. When, as in the related art, the wiring to which the other of the two drive voltages for the APD is applied is disposed in the same layer as the reflective metal layer 322 and an area of the reflective metal layer is increased, there is a possibility that the withstand voltage cannot be ensured because a distance between the reflective metal layer and the wiring to which the other drive voltage is applied becomes short.

Accordingly, in this embodiment, the wiring layer including the wiring 326 to which the voltage to be applied to one node of the APD is supplied is made different from the wiring layer including the reflective metal layer 322. Thus, the reflective metal layer 322 is disposed in a layer positioned closer to the semiconductor layer 302 than the wiring layer in which the wiring 326 is disposed. Stated in another way, a distance between the reflective metal layer 322 and the semiconductor layer 302 is shorter than that between the wiring 326 and the semiconductor layer 302. For example, in FIG. 6, no wiring is disposed between the contact plug 321 and the via 324, and the contact plug 321 and the via 324 are directly connected by stacking them. In other words, the contact plug is formed by stacking a first via and a second via. In the same wiring layer as the reflective metal layer 322, at least one of the contact plug 321 and the via 324 is disposed, and the wiring for supplying the potential to the anode of the APD is not disposed. Thus, part of the contact plug formed by stacking the first via and the second via is disposed at the same height as the reflective metal layer 322.

A method of fabricating the contact plug 321 and the via 324 by direct stacking is as follows.

First, the contact plug 320 and the contact plug 321 are formed. Then, the reflective metal layer 322 is formed. At that time, the wiring for the anode is not formed. Then, the via 323 and the via 324 are formed. Then, the wiring 325 and the wiring 326 are formed.

Without connecting the contact plug 321 and the via 324 by stacking them, the distance between the reflective metal layer 322 and the semiconductor layer 302 may be made shorter than that between the wiring 326 and the semiconductor layer 302. In other words, the contact plug 321 may be formed deeper than the contact plug 320, and the contact plug 321 and the wiring 326 may be directly connected.

A fabrication method in the above-mentioned case is as follows. First, the contact plug 320 is formed. Then, the reflective metal layer 322 is formed. Then, the via 323 is formed. Then, the contact plug 321 is formed to continuously extend from the second surface of the semiconductor layer 302 to the same depth as the wiring 325 on a side facing the circuit substrate 21. Then, the wiring 325 and the wiring 326 are formed.

Since the reflective metal layer 322 is positioned closer to the semiconductor layer 302 as described above, it is possible to increase the area of the reflective metal layer 322 and to improve the sensitivity of the APD for the long-wavelength light while the withstand voltage between the reflective metal layer 322 and the wiring 326 is ensured.

In one embodiment, the distance between the reflective metal layer 322 and the semiconductor layer 302 is set to, for example, 0.05 µm or longer and 2 µm or shorter and in another embodiment, for example, 0.1 µm or longer and 0.8 µm or shorter. By setting the above-mentioned distance to a predetermined value or more, the withstand voltage between the semiconductor layer 302 and the reflective metal layer 322 can be ensured. On the other hand, by setting the above-mentioned distance to a predetermined value or less, it is easy to further reflect the light having passed through the semiconductor layer 302 toward the semiconductor layer 302 and improve the sensitivity of the APD.

In one embodiment, the wiring 326 held at the same potential as that applied to the anode of the APD is disposed to cover a gap between the via 324 and the reflective metal layer 322 when viewed in plan. This arrangement enables light having passed through the gap between the via 324 and the reflective metal layer 322 to be reflected by the wiring 326 and to be absorbed by the semiconductor layer 302. The wiring 326 is disposed to continuously overlap the reflective metal layer 322 and the via 324 when viewed in plan.

An active region 411 and an element isolation region 412 are formed in the semiconductor layer 402 of the circuit substrate 21. For example, PN junction isolation or isolation separation, such as Shallow Trench Isolation (STI) or Deep Trench Isolation (DTI), can be utilized for the element isolation region 412.

A signal output from the APD in the sensor substrate 11 is supplied to the processing circuit in the circuit substrate 21 through the wiring 432, a via 431, a wiring 426, a via 425, a wiring 424, a via 423, a wiring 422, and a contact plug 421, those wirings, vias and contact plug providing metal bonding.

As illustrated in FIG. 6, the pad electrode 354 and the pad electrode 352 are disposed in the sensor substrate 11. The voltage supplied from the pad electrode 352 is supplied to only the sensor substrate 11 and is not supplied to the circuit substrate 21. The voltage supplied from the pad electrode 354 is supplied to the semiconductor layer 402 through some of the metal bonded portions. Thus, due to the configuration that, of the drive voltages applied to the APD, the voltage with the higher absolute value is not applied to the circuit substrate 21, a reduction in reliability of the photoelectric conversion apparatus is suppressed.

As illustrated in FIG. 6, some of the metal bonded portions are disposed between the pad electrode 352 and the semiconductor layer 402. Those metal bonded portions are not connected to the wirings in the other wiring layers.

With the presence of those metal bonded portions, bonding strength between the sensor substrate 11 and the circuit substrate 21 near the pad electrode 352 is ensured.

FIG. 6 discloses that some of the metal bonded portions not connected to the semiconductor layers 302 and 402 are disposed in the pixel region. With the presence of the metal bonded portions, a reduction in the bonding strength between the sensor substrate 11 and the circuit substrate 21 can be suppressed in the pixel region as well. Those metal bonded portions are not essential, and one metal bonded portion for reading out the signal from the APD is to be disposed in the pixel region corresponding to each APD. In other words, it is at least required that only the metal bonded portion for reading out the signal from the APD is disposed corresponding to each APD. Although, in FIG. 6, the pad electrode is drawn in a smaller size than the APD for easier understanding of explanation, the APD may have a smaller size than the pad electrode. The number of the metal bonded portions connected to the pad electrode 354 may be three or more.

Although, in FIG. 6, the pad electrode 354 and the pad electrode 352 are disposed in the sensor substrate 11, those pad electrodes 354 and 352 may be disposed in the circuit substrate 21. In such a case, from the viewpoint of the withstand voltage, the pad electrodes are formed such that the potential applied from the pad electrode 352 is not applied to the semiconductor layer 402.

FIG. 7A is a schematic plan view taken along VIIA-VIIA in FIG. 6 at the height at which the reflective metal layer 322 is disposed, and FIG. 7B is a schematic plan view taken along VIIB-VIIB in FIG. 6 at the height at which the wirings 325 and 326 are disposed.

As illustrated in FIG. 7A, the multiple vias 324 are disposed to surround the reflective metal layer 322 when viewed in plan. In FIG. 6, the fourth semiconductor region 314 is disposed to surround the first semiconductor region 311 when viewed in plan. The potential is supplied to the fourth semiconductor region 314 through the vias 324.

One of the two voltages for driving the APD is applied to the reflective metal layer 322, and the other of the two voltages for driving the APD is applied to each of the vias 324. Accordingly, as described above, the reflective metal layer 322 and the via 324 are to be disposed to ensure a certain distance at which dielectric breakdown is not caused. In one embodiment, the distance between the reflective metal layer 322 and the via 324 is, for example, 0.4 µm or longer and 1.5 µm or shorter and in another embodiment, for example, 0.5 µm or longer and 1.0 µm or shorter. The withstand voltage between the reflective metal layer 322 and the via 324 can be ensured by ensuring a predetermined distance or more therebetween. On the other hand, the sensitivity of the APD for the long-wavelength light can be improved by setting the above-mentioned distance to a predetermined value or less.

As seen from FIG. 7B, the wiring 325 at the same potential as the cathode of the APD is electrically connected to the reflective metal layer 322 in FIG. 7A, and the anode of the APD and the wiring 326 are electrically connected to the vias 324 in FIG. 7A.

As illustrated in FIG. 7B, the wiring 326 is a continuous planar member when viewed in plan. The potential supplied from the pad electrode 352 illustrated in FIG. 6 is supplied to the wiring 326, whereby the voltage is applied to the anodes of the multiple APDs. Stated in another way, the common potential is supplied to the anodes of the multiple APDs through the common wiring 326. On the other hand, the reflective metal layer 322 and the wiring 325 are disposed individually for each APD. Thus, one reflective metal layer 322 and one wiring 325 are disposed for one APD. Accordingly, the signal for each of the APDs can be read out individually.

Another example of the reflective metal layer 322, the wiring 325, and the wiring 326 is described with reference to FIGS. 8A and 8B. FIG. 8A represents another example of the reflective metal layer 322 illustrated in FIG. 7A, and FIG. 8B represents another example of the wirings 325 and 326 illustrated in FIG. 7B.

FIGS. 8A and 8B are different from FIGS. 7A and 7B in that, when viewed in plan, corners of the reflective metal layer 322 and the wiring 325 are cut and the wiring 326 has a shape in match with the shape of the wiring 325. Stated in another way, in the other examples, each of the reflective metal layer 322 and the wiring 325 has an octagonal shape when viewed in plan, and an opening in the wiring 326 corresponding to the wiring 325 also has an octagonal shape. Thus, the reflective metal layer 322 has eight sides, and the opening in the wiring 326 has eight sides. As described above, the cathode voltage for driving the APD is supplied to the reflective metal layer 322 and the wiring 325. The anode voltage for driving the APD is supplied to the vias 324 and the wiring 326. An electric field has properties of tending to concentrate at corners. Therefore, when the reflective metal layer 322, the via 324, the wiring 325, and the wiring 326 have corners, there is a possibility that the electric field concentrates at the corners. By contrast, in FIG. 8, since the reflective metal layer 322 has no corners with an angle of 90° or less, the electric field can be suppressed from excessively concentrating at the corners.

Here, the wording "quadrangular or octagonal shape when viewed in plan" includes the case in which corners are chamfered. Thus, in this Specification, a shape being quadrangular or octagonal in a macroscopic view without having corners is also called the quadrangular or octagonal shape. Although the drawing illustrates an example in which the reflective metal layer 322 has eight sides, an effect of suppressing concentration of the electric field can be obtained when the reflective metal layer 322 has at least five sides.

Second Embodiment

Figure 9:
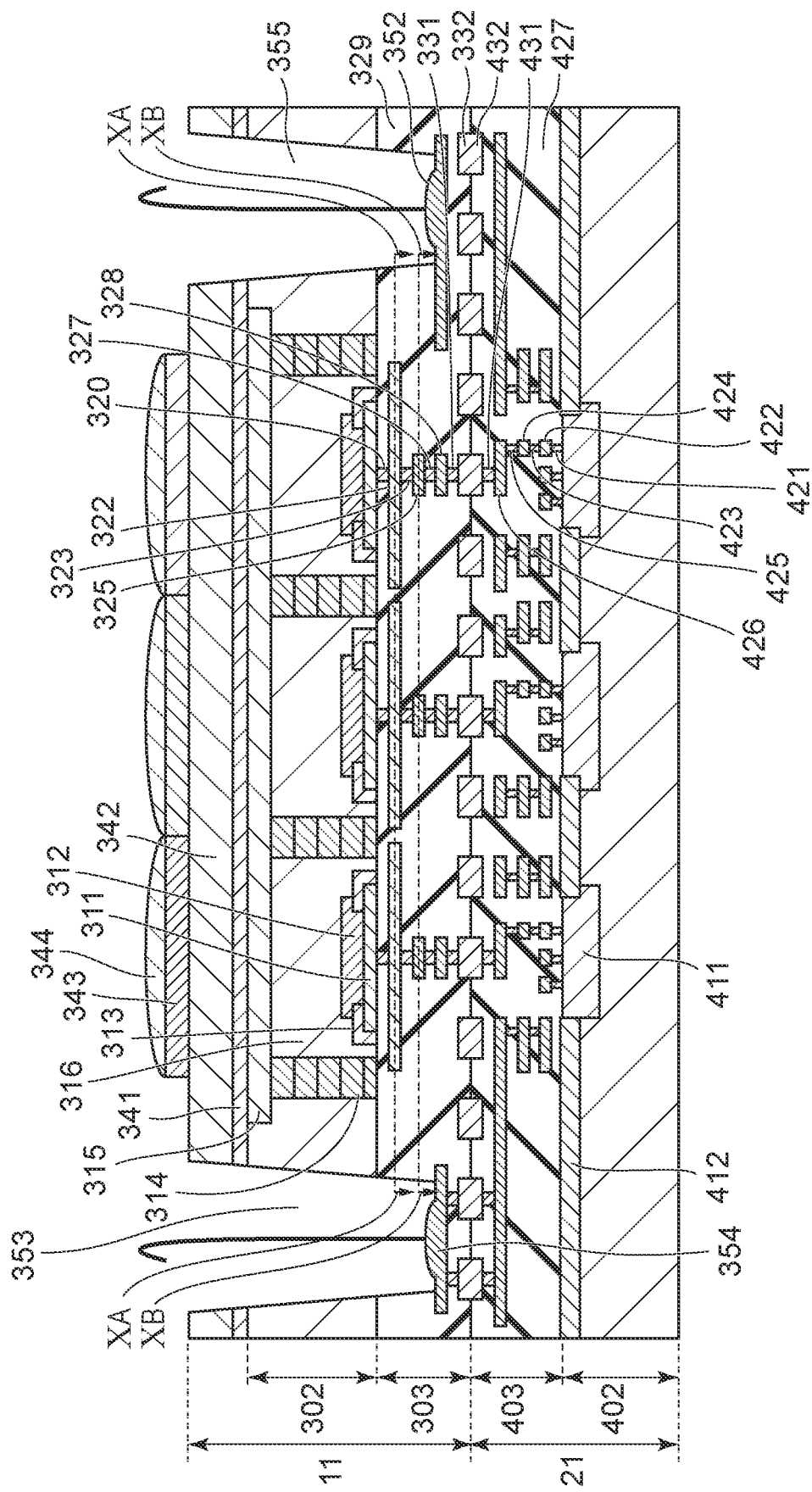
FIG. 9 is a schematic sectional view of a photoelectric conversion apparatus according to a second embodiment.
Figure 10A:
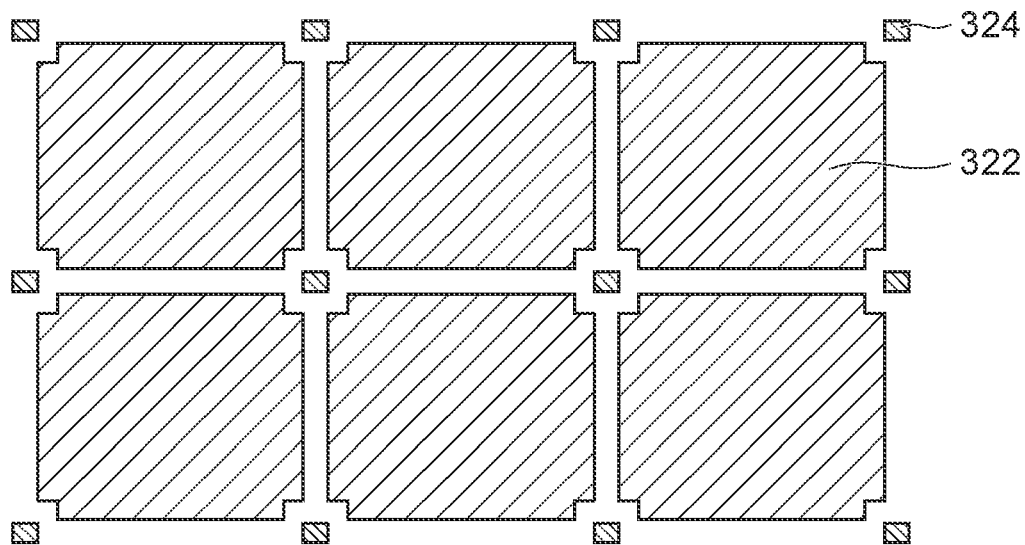
FIGS. 10A and 10B are schematic plan views of the photoelectric conversion apparatus according to the second embodiment.
Figure 10B:
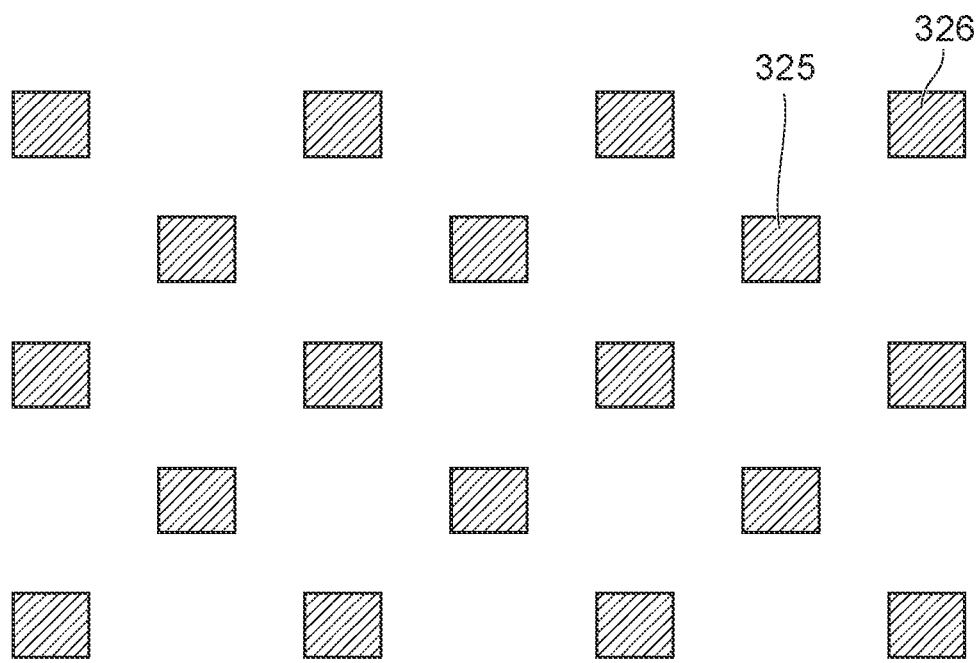

A photoelectric conversion apparatus according to a second embodiment will be described below with reference to FIGS. 9, 10A, and 10B. FIG. 9 is a schematic sectional view of the photoelectric conversion apparatus according to this embodiment. FIG. 10A is a schematic sectional view taken along XA-XA in FIG. 9, and FIG. 10B is a schematic sectional view taken along XB-XB in FIG. 9.

The photoelectric conversion apparatus according to this embodiment is different from the photoelectric conversion apparatus according to the first embodiment in positions at which the vias 324 are disposed and in that the wiring 326 does not have a continuous shape. Features except for the above points and matters described below are substantially similar to those in the first embodiment. Hence similar components to those in the first embodiment are denoted by the same reference signs, and description of those components is omitted in some cases.

FIG. 9 is a pixel sectional view taken in a first direction when a pixel array in the sensor substrate 11 is viewed in plan.

The first direction is, for example, an opposite side direction of the APD. Thus, FIG. 9 is a schematic sectional view of the APDs arrayed in a horizontal direction in FIG. 10A. Because the vias 324 connected to the fourth semiconductor region 314 forming the anode of the APD are arranged in a second direction intersecting the first direction, the vias 324 do not appear in FIG. 9. The second direction is, for example, a diagonal direction of the APD. The vias 324 are arranged on the diagonal line of the APD and hence do not appear on FIG. 9. As illustrated in FIG. 10A, the vias 324 disposed around the reflective metal layer 322 are arranged only in the diagonal direction between the pixels and are not arranged in the opposite side direction. In other words, the vias 324 are disposed between diagonally adjacent ones among six APDs that are arrayed in two rows and three columns, while the vias 324 are not disposed between the APDs that are arrayed in a left-right direction and an up-down direction.

As in the first embodiment, the voltage with the lower absolute value for driving the APD is applied to one of the reflective metal layer 322 and the via 324, and the voltage with the higher absolute value for driving the APD is applied to the other. Accordingly, a certain distance at which dielectric breakdown is not caused is to be ensured between the reflective metal layer 322 and the via 324. For example, the voltage with the lower absolute value for driving the APD is applied to the reflective metal layer 322, and the voltage with the higher absolute value for driving the APD is applied to the via 324.

In this embodiment, gaps between adjacent twos of the pixels in the opposite side direction face the reflective metal layers 322 that are held at the same potential. In other words, the via 324 is not disposed between the adjacent pixels in the opposite side direction. Accordingly, a space between the reflective metal layers 322 arrayed in the left-right direction and the up-down direction can be reduced in comparison with that in the first embodiment. With the structure according to this embodiment, an area of the reflective metal layer 322 can be increased in comparison with that in the first embodiment, and sensitivity of the pixel, especially sensitivity for the long-wavelength light, can be easily increased.

FIG. 10B is a schematic plan view taken along XB-XB in FIG. 9 at the height of the wiring layer in which the wirings 325 and 326 are disposed. The wiring 325 at the same potential as the cathode of the APD is electrically connected to the reflective metal layer 322 in FIG. 10A, and the wiring 326 at the same potential as the anode of the APD is electrically connected to the via 324 in FIG. 10A. In FIG. 10B, the wiring 326 is disposed at a level position corresponding to the wiring 325. Stated in another way, the individual wirings 326 are disposed instead of the continuous wiring 326. Without being limited to the above-described example, the wiring 326 may be continuously disposed as illustrated in FIG. 7B.

According to this embodiment, as in the first embodiment, the sensitivity of the APD can be improved while the withstand voltage between the via 324 and the reflective metal layer 322 is ensured. Furthermore, this embodiment is easy to further improve the sensitivity of the APD than in the first embodiment.

Comparing the area of the reflective metal layer between the case of adopting this embodiment and the case of not adopting this embodiment, by way of example, it can be expected that the area of the reflective metal layer increases about 10% or more with respect to a pixel size of 5 μm or less, although depending on a wavelength, by adopting this embodiment.

Third Embodiment

Figure 11:
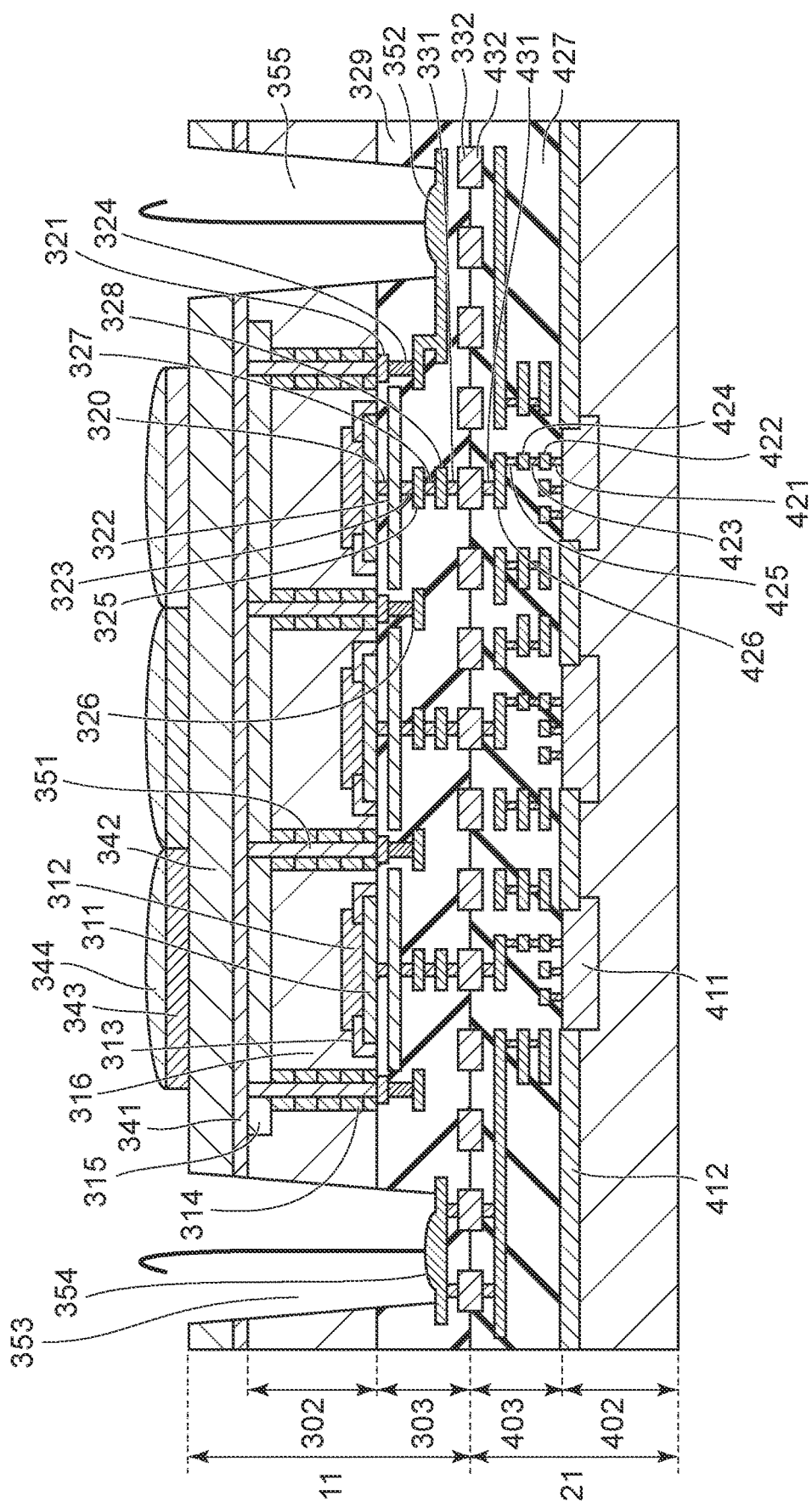
FIG. 11 is a schematic sectional view of a photoelectric conversion apparatus according to a third embodiment.

FIG. 11 is a schematic sectional view of a photoelectric conversion apparatus according to a third embodiment. The photoelectric conversion apparatus according to this embodiment is different from the photoelectric conversion apparatus according to the first embodiment in that a DTI 351 is disposed as an isolation portion between the adjacent pixels. Features except for the above point and matters described below are substantially similar to those in the first embodiment. Hence similar components to those in the first embodiment are denoted by the same reference signs, and description of those components is omitted in some cases.

As illustrated in FIG. 11, the DTI 351 is disposed between the adjacent pixels. This provides an effect of suppressing light reflected by the reflective metal layer 322 from crosstalking with the adjacent pixels.

In FIG. 11, the DTI 351 is disposed to penetrate through the semiconductor layer 302 from the first surface to the second surface. Since the DTI 351 is disposed in a penetration structure as mentioned above, the effect of suppressing the crosstalk to the adjacent pixels can be increased in comparison with the case of disposing the DTI 351 in a non-penetration structure.

The DTI 351 is not always required to penetrate through the semiconductor layer 302 and may be disposed to partially extend in the semiconductor layer 302. For example, trench isolation may be partially provided to extend from the surface (second surface) of the semiconductor layer 302 on the side where the circuit substrate 21 is disposed toward the first surface. In one embodiment, a depth of the DTI 351 not penetrating through the semiconductor layer 302 is not limited to a specific value, but the depth is ½ or more of a thickness of the semiconductor layer 302 from the viewpoint of suppressing the crosstalk.

The DTI 351 may be filled with an oxide film or metal. In one embodiment, the metal is filled from the viewpoint of suppressing the crosstalk. The filled metal enables the light reflected by the reflective metal layer 322 to be further suppressed from cross-talking with the adjacent pixels. For example, when the light reflected by the reflective metal layer 322 hits the DTI 351 at an angle θ, a material and a film thickness of the DTI are selected and designed to increase reflectance at the wavelength of the light and the angle θ.

In one embodiment, the fourth semiconductor region 314 of the second conductivity type is disposed at a sidewall of the DTI 351. This is effective in suppressing the influence of a dark current generating from the sidewall of the DTI 351.

In one embodiment, the contact plug 321 connected to the anode of the APD is disposed to cover the DTI 351 when viewed in plan. For example, the contact plug 321 is disposed to be in contact with the fourth semiconductor region 314 of one pixel, the DTI 351, and the fourth semiconductor region 314 of another pixel adjacent to the one pixel. This enables the APD drive voltage to be supplied to both the fourth semiconductor regions 314 of the adjacent pixels through one contact plug 321.

According to this embodiment, as in the first embodiment, the sensitivity of the APD can be improved while the withstand voltage between the via 324 and the reflective metal layer 322 is ensured. Furthermore, this embodiment is easy to further improve the sensitivity of the APD than in the first embodiment. Moreover, according to this embodiment, in comparison with the first embodiment, an effective length over which the light reflected by the reflective metal layer 322 is absorbed in the semiconductor layer 302 can be increased, and hence the sensitivity for the long-wavelength light can be improved. In addition, according to this embodiment, since the DTI 351 is disposed, electric charges generated in one pixel can be suppressed from mixing into the adjacent pixels. The provision of the DTI 351 makes it easy to further reduce incidence of light emitted from the avalanche multiplication region of the APD into the adjacent pixels.

Fourth Embodiment

Figure 12:
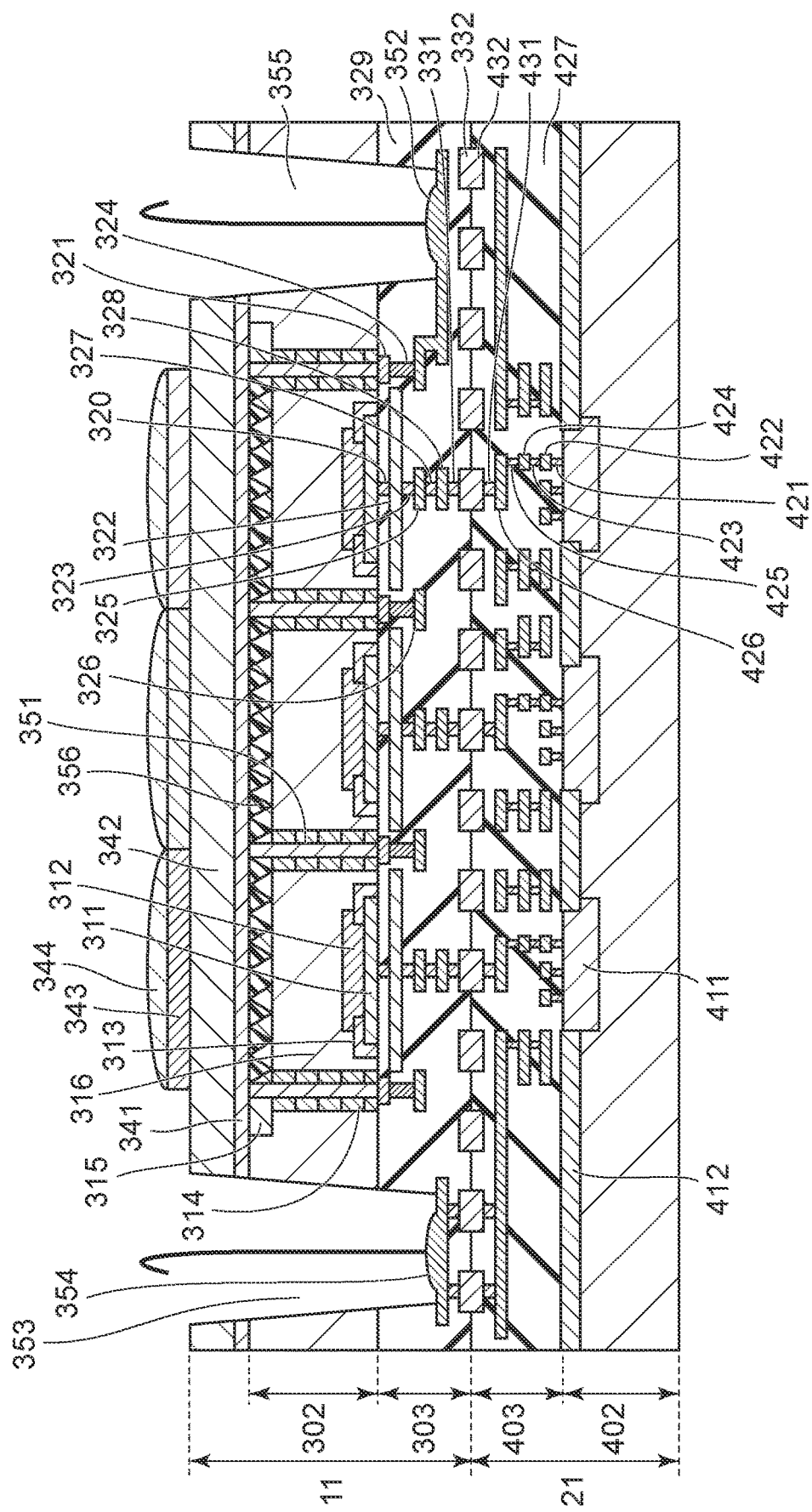
FIG. 12 is a schematic sectional view of a photoelectric conversion apparatus according to a fourth embodiment.

FIG. 12 is a schematic sectional view of a photoelectric conversion apparatus according to a fourth embodiment. The photoelectric conversion apparatus according to this embodiment is different from the photoelectric conversion apparatus according to the third embodiment in that a scattering structure 356 is disposed in the first surface of the semiconductor layer 302. Features except for the above point and matters described below are substantially similar to those in the third embodiment. Hence similar components to those in the third embodiment are denoted by the same reference signs, and description of those components is omitted in some cases.

As illustrated in FIG. 12, the structure 356 for scattering or diffracting light is disposed in the light incident surface of the semiconductor layer 302. The scattered or diffracted light is reflected by not only the reflective metal layer 322, but also the DTI 351 between the adjacent pixels. Accordingly, an effective length through which the incident light advances in the semiconductor layer 302 is increased. Thus, even when the semiconductor layer 302 has the same thickness as in the third embodiment, a rate of absorption of the light by the semiconductor layer 302 is increased, and the sensitivity can be improved in comparison with that in the third embodiment.

Multiple recesses are formed as the scattering structure 356. The scattering structure 356 enables the light incident on the first surface of the semiconductor layer 302 to be scattered, whereby an optical path until reaching the second surface can be prolonged. In one embodiment, when the incident light is infrared light, it is necessary to prolong a distance through which the infrared light advances before the photoelectric conversion, and to reduce an amount of the light that disappears without being subjected to the photoelectric conversion. Hence an effect obtained with the scattering structure 356 is more significant in the case of using the infrared light.

The number and shape of the recesses formed as the scattering structure 356 can be designed as appropriate according to the incident light. As illustrated in FIG. 12, the recesses may be formed in a triangular shape over the entirety of the first surface within the pixel in the sectional view. Alternatively, the recesses may have a pyramidal shape.

Figure 13:
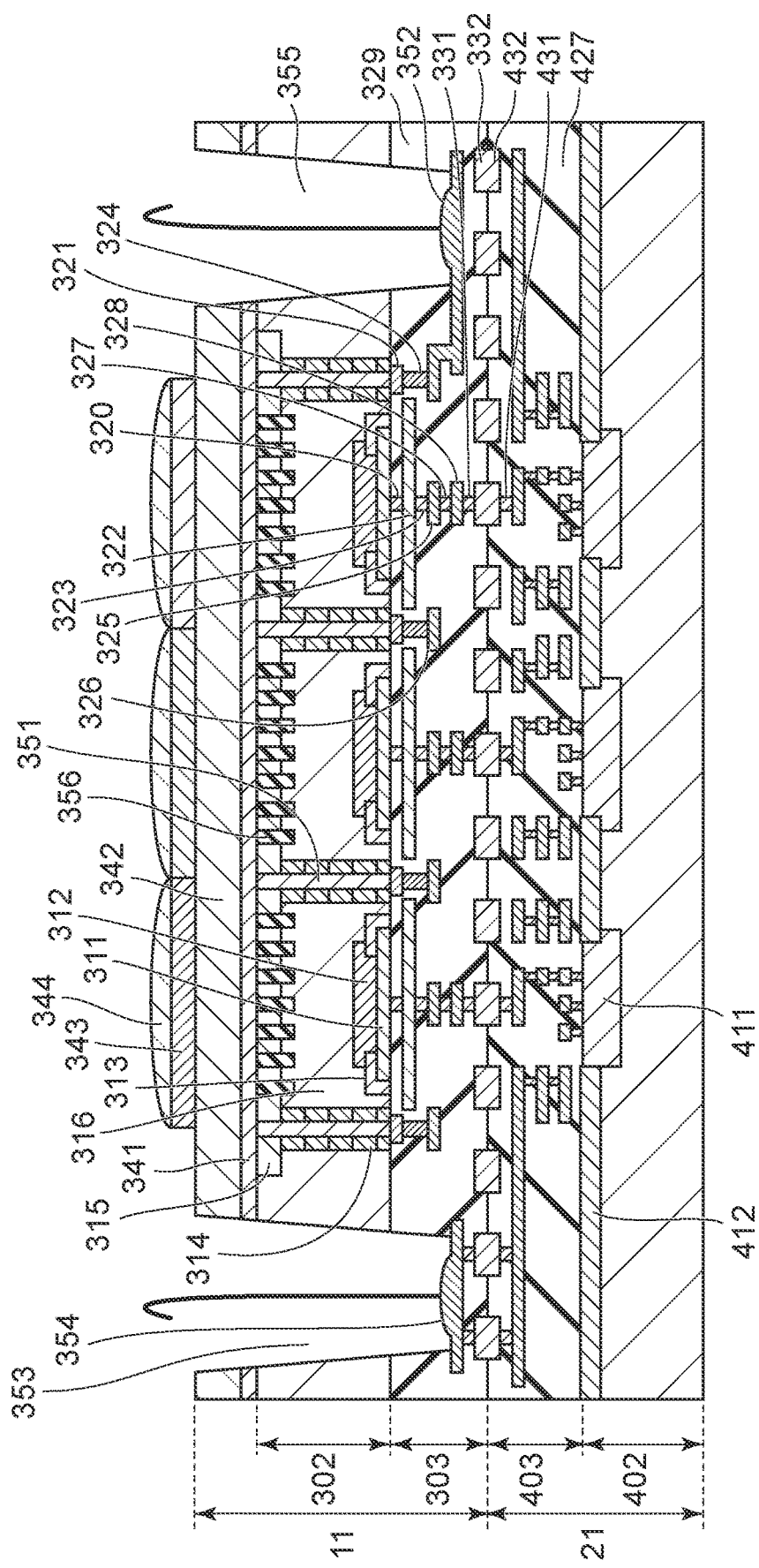
FIG. 13 is a schematic sectional view of a photoelectric conversion apparatus according to a modification of the fourth embodiment.

As illustrated in FIG. 13, the recesses may be partially formed in the first surface within the pixel. With the configuration of FIG. 13, a scattering or diffraction angle of the incident light can be made smaller with respect to a light incident angle. Accordingly, the sensitivity for the infrared light can be improved while leak of the light to the adjacent pixels is suppressed.

As illustrated in FIG. 12, a width of one recess is set to, for example, 1/30 or more and 1/3 or less with respect to the width of the pixel. According to another aspect, the width of one recess may be set to, for example, 10 nm or more and 1 μm or less. A depth of one recess may be set to, for example, 1/50 or more and 1/3 or less with respect to the distance from the first surface to the second surface.

The shape of the recesses may be, for example, triangular or trapezoidal. Apexes of the triangular or trapezoidal shape may be rounded. The recesses may not need to be continuously formed in the first surface. For example, a region where no recesses are formed may exist between the adjacent recesses and between the recess and the DTI 351. The recesses can be formed by a known method such as dry etching.

An insulator is disposed in the recesses of the scattering structure 356. For example, silicon oxide or silicon nitride can be used as a material of the insulator.

According to this embodiment, as in the third embodiment, the sensitivity of the APD can be improved while the withstand voltage between the via 324 and the reflective metal layer 322 is ensured. Furthermore, since the light is scattered by the scattering structure 356, an optical path up to the avalanche multiplication region can be prolonged in comparison with that in the third embodiment. As a result, the infrared light can be photoelectrically converted with higher efficiency.

Fifth Embodiment

Figure 14:
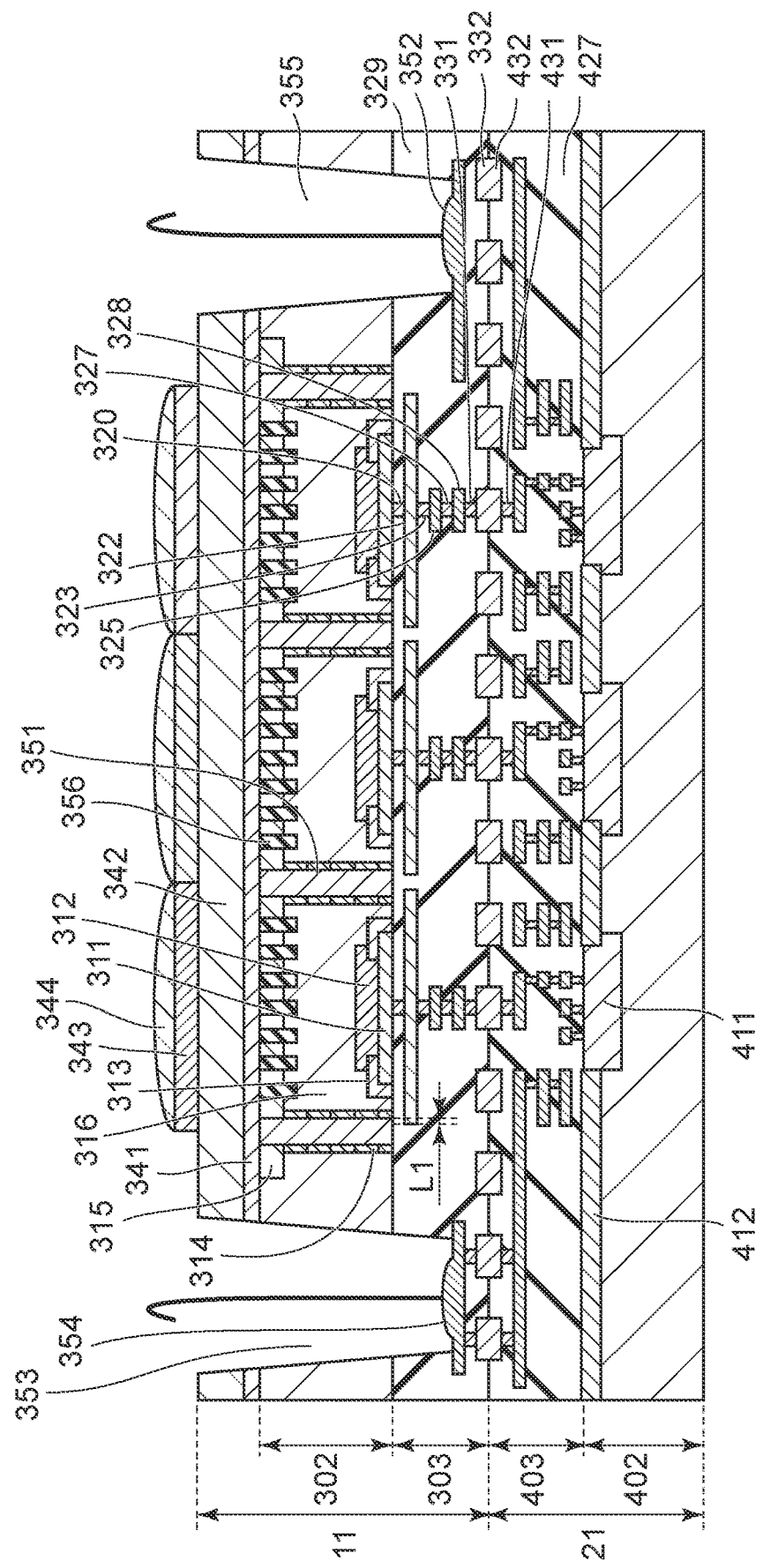
FIG. 14 is a schematic sectional view of a photoelectric conversion apparatus according to a fifth embodiment.

FIG. 14 is a schematic sectional view of a photoelectric conversion apparatus according to a fifth embodiment. The photoelectric conversion apparatus according to this embodiment is different from the photoelectric conversion apparatus according to the fourth embodiment in that the DTI 351 has a greater width. Features except for the above point and matters described below are substantially similar to those in the fourth embodiment. Hence similar components to those in the fourth embodiment are denoted by the same reference signs, and description of those components is omitted in some cases.

FIG. 14 is a schematic sectional view of the pixel in the opposite side direction when the pixel region is viewed in plan. A width of the DTI 351 between the adjacent pixels is set, for example, such that the DTI 351 and the reflective metal layer 322 overlap when viewed in plan. In a cross-section passing the APD, the reflective metal layer 322 is disposed under the APD, and a length of the reflective metal layer 322 from one end to the other end is longer than a length from one DTI 351 to another adjacent DTI 351. The DTI 351 and the reflective metal layer 322 are disposed to overlap by a distance L1, for example.

According to this embodiment, since the light scattered or diffracted by the DTI 351 disposed in the light incident surface of the semiconductor layer 302 is reflected to the semiconductor layer 302 without leaking, the sensitivity of the pixel can be improved in comparison with that in the fourth embodiment.

Sixth Embodiment

Figure 15:
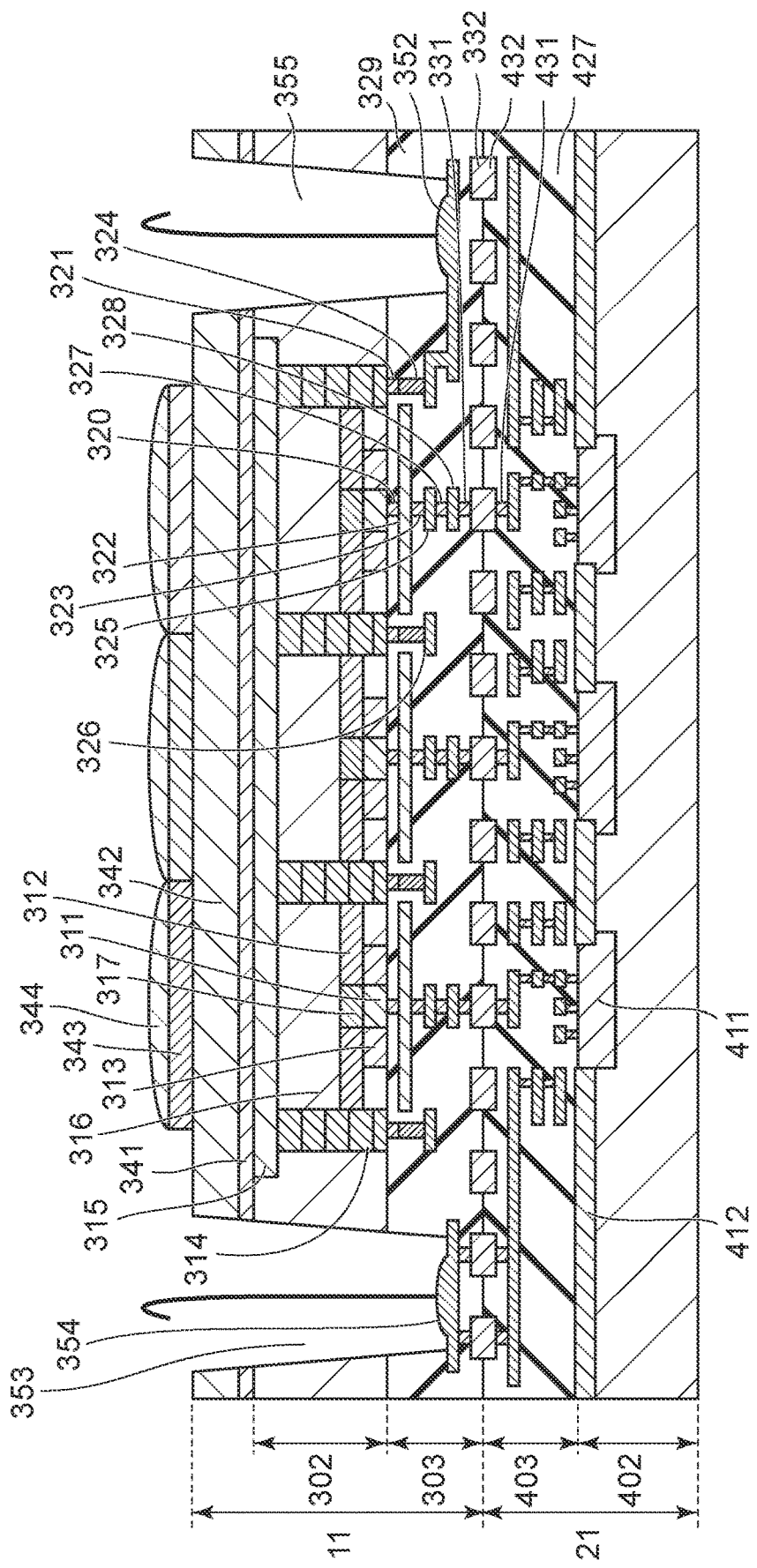
FIG. 15 is a schematic sectional view of a photoelectric conversion apparatus according to a sixth embodiment.

FIG. 15 is a schematic sectional view of a photoelectric conversion apparatus according to a sixth embodiment. The photoelectric conversion apparatus according to this embodiment is different from the photoelectric conversion apparatus according to the first embodiment in that the avalanche multiplication region is smaller than in the first embodiment, and that the signal carriers are collected into the avalanche multiplication region. Features except for the above points and matters described below are substantially similar to those in the first embodiment. Hence similar components to those in the first embodiment are denoted by the same reference signs, and description of those components is omitted in some cases.

The PN junction is formed between the first semiconductor region 311 of the first conductivity type and the second semiconductor region 312 of the second conductivity type. A seventh semiconductor region 317 of the second conductivity type is disposed at a position overlapping the first semiconductor region 311 when viewed in plan. The seventh semiconductor region 317 is given with a lower potential for the signal carriers than that given to the second semiconductor region 312. The electric charges photoelectrically converted in the sixth semiconductor region 316 are multiplied in the avalanche multiplication region between the first semiconductor region 311 and the second semiconductor region 312 while passing through the seventh semiconductor region 317 and are then read out from the contact plug 320 serving as the cathode.

Although the above description is made in connection with the case in which the seventh semiconductor region is of the second conductivity type, the seventh semiconductor region 317 may be a semiconductor region of the first conductivity type insofar as the above-mentioned potential relationship can be realized. The seventh semiconductor region 317 may be formed by setting the impurity concentration to be lower than in the second semiconductor region 312 at the time of ion injection. As an alternative, the impurity concentration may be the same as in the second semiconductor region 312 at the time of the ion injection and may be eventually reduced to be lower than that in the second semiconductor region 312 due to, for example, an influence of ion injection into the first semiconductor region 311.

In this embodiment, the sixth semiconductor region 316 is formed by a semiconductor region of the first conductivity type. The impurity concentration in the sixth semiconductor region 316 may be uniform or may be set such that the impurity concentration in a region overlapping the seventh semiconductor region 317 when viewed in plan is higher than in a region overlapping the second semiconductor region 312 when viewed in plan. This can form a potential structure capable of causing the electric charges generated in end portions of the sixth semiconductor region 316 to be moved to the seventh semiconductor region 317. The end portions of the sixth semiconductor region 316 are, for example, a portion near a region where the fourth semiconductor region 314 and the fifth semiconductor region 315 intersect, and a portion near a region where the fourth semiconductor region 314 and the second semiconductor region 312 intersect.

As illustrated in FIG. 15, the fifth semiconductor region 315 may be disposed to extend up to a position between the pixel region and the pad region. In other words, the fifth semiconductor region 315 may be disposed such that a region where the fifth semiconductor region 315 is disposed is larger than the pixel region when viewed in plan.

According to this embodiment, as in the first embodiment, the sensitivity of the APD can be improved while the withstand voltage between the via 324 and the reflective metal layer 322 is ensured. Furthermore, since the electric charges generated in the sixth semiconductor region 316 can be collected and subjected to the avalanche multiplication, it is easy to further improve the sensitivity of the APD. In addition, the avalanche multiplication region can be reduced, and hence the dark current can be reduced.

Seventh Embodiment

FIGS. 16, 17A, 17B, 17C, 17D and 17E are schematic sectional views of a photoelectric conversion apparatus according to a seventh embodiment. The photoelectric conversion apparatus according to this embodiment is different from the photoelectric conversion apparatus according to the sixth embodiment in shapes of the wiring layers. Another different point from the sixth embodiment is that the reflective metal layer 322 is not disposed. Features except for the above points and matters described below are substantially similar to those in the sixth embodiment. Hence similar components to those in the sixth embodiment are denoted by the same reference signs, and description of those components is omitted in some cases.

Figure 16:
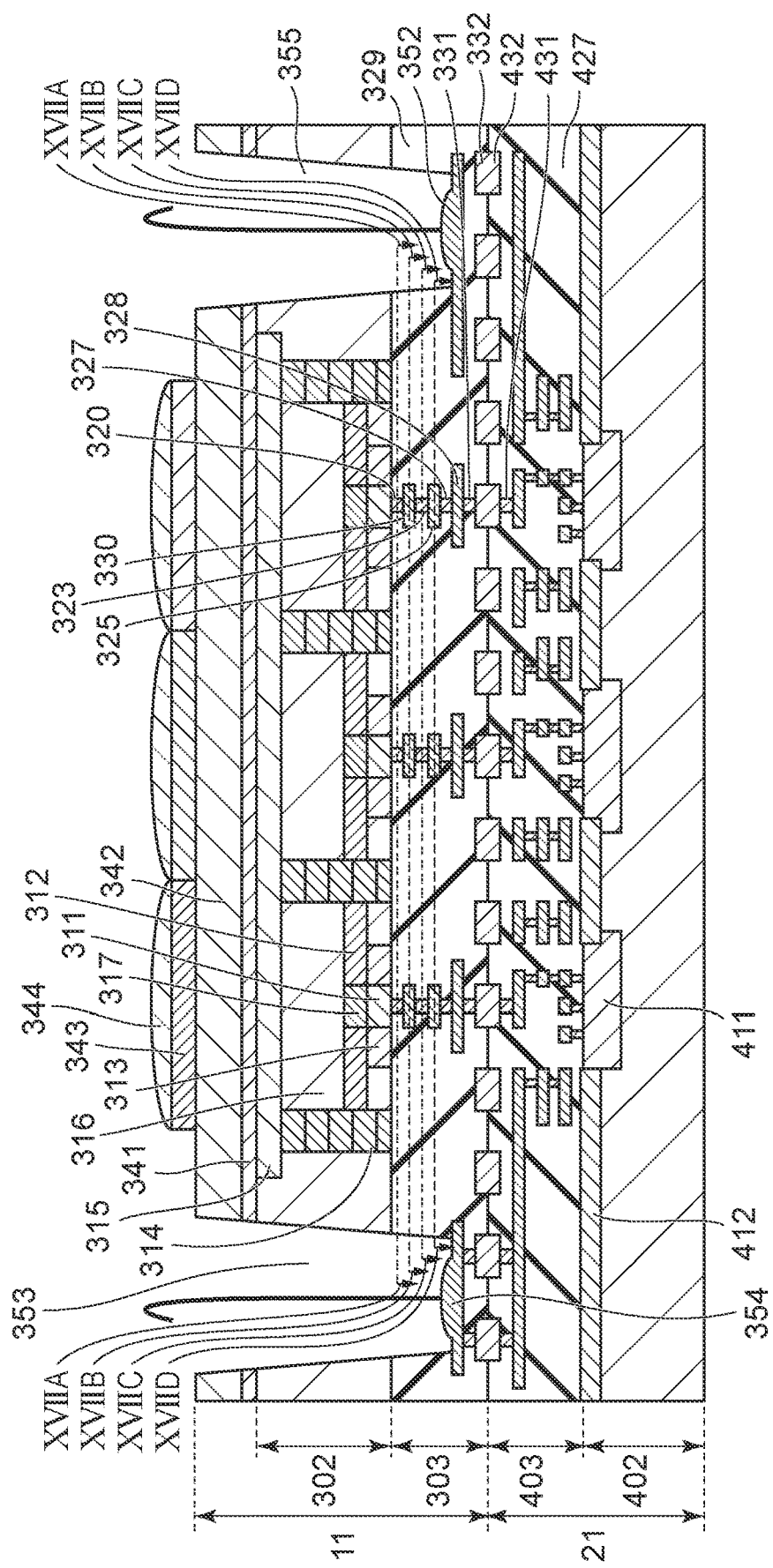
FIG. 16 is a schematic sectional view of a photoelectric conversion apparatus according to a seventh embodiment.
Figure 17A:
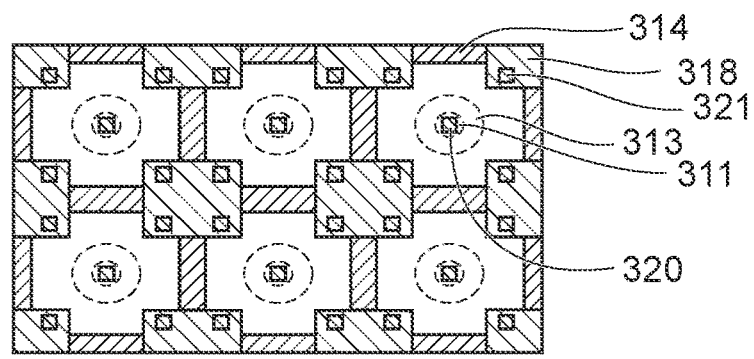
FIGS. 17A, 17B, 17C, 17D and 17E are schematic plan views of the photoelectric conversion apparatus according to the seventh embodiment.
Figure 17B:
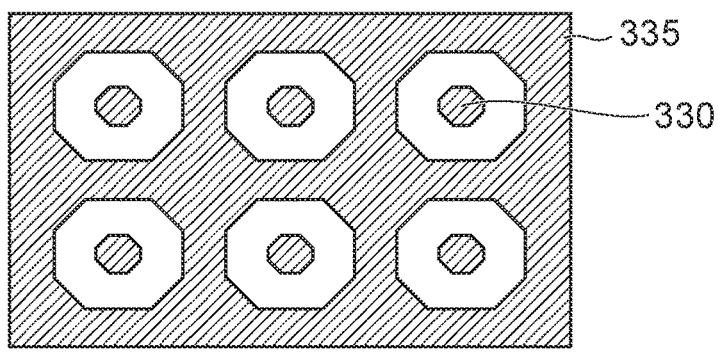
Figure 17C:
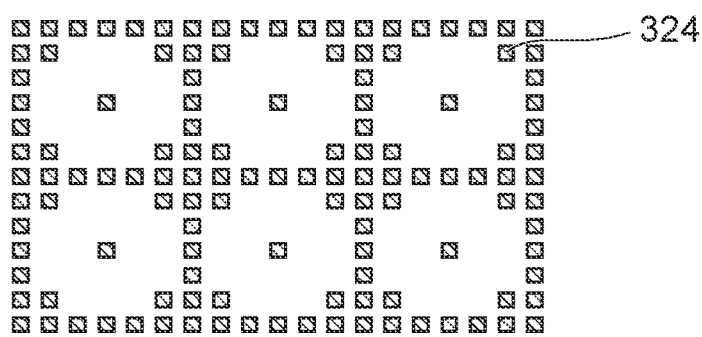
Figure 17D:
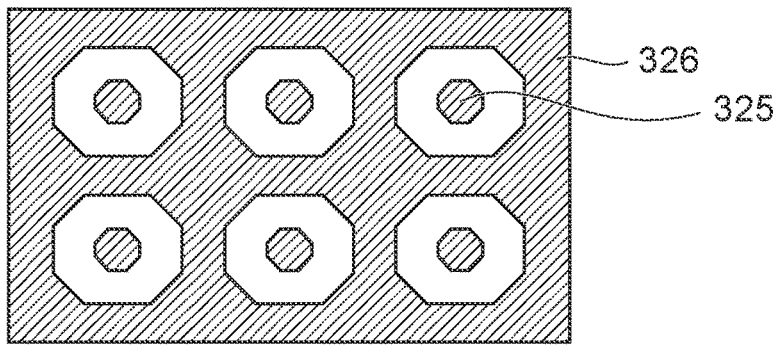

FIG. 16 is a schematic sectional view of the pixels arrayed in the opposite side direction. FIG. 17A is a schematic plan view taken along XVIIA-XVIIA in FIG. 16, and FIG. 17B is a schematic plan view taken along XVIIB-XVIIB in FIG. 16. FIG. 17C is a schematic plan view taken along XVIIC-XVIIC in FIG. 16, and FIG. 17D is a schematic plan view taken along XVIID-XVIID in FIG. 16. FIG. 17A further illustrates part of the semiconductor region of the semiconductor layer 302 in dotted lines for easier understanding regarding to which semiconductor region the contact plug is connected.

The contact plug 321 is connected to the fourth semiconductor region 314 through an eighth semiconductor region 318 of the second conductivity type. The eighth semiconductor region 318 is a semiconductor region with a higher impurity concentration than the fourth semiconductor region 314. Positions at which the fourth semiconductor region 314 and the eighth semiconductor region 318 are disposed may not need to be in match with each other as illustrated in FIG. 17A. Alternatively, the fourth semiconductor region 314 and the eighth semiconductor region 318 may be positioned in match with each other. The eighth semiconductor region 318 may be disposed to overlap part of the fourth semiconductor region 314 when viewed in plan. In such a case, the contact plug 321 and the fourth semiconductor region 314 are disposed to overlap when viewed in plan.

As illustrated in FIGS. 16 and 17B, a wiring 330 to which the drive voltage for the APD is supplied is disposed in a wiring layer in which a wiring 335 is disposed. Thus, in this embodiment, the wiring for supplying one of the drive voltages for the APD and the wiring for supplying the other drive voltage are disposed in the same wiring layer. Even in this case, the withstand voltage between the wiring 335 and the wiring 330 can be ensured by holding a certain distance therebetween. Furthermore, at corners of the wirings illustrated in FIG. 17B, there is a possibility that an electric field concentrates at the corners and dielectric breakdown is more likely to occur. Accordingly, reliability is ensured by forming the wiring 330 not to have corners with an angle of 90 degree or less, as illustrated in FIG. 17B. In addition, the shape of an opening in the wiring 335 is made in match with the shape of the wiring 330.

As illustrated in FIG. 17C, the via 324 may be disposed as multiple vias. Of the drive voltages for the APD, the voltage with the higher absolute value is applied to the vias 324 that are connected to the wiring 326. By connecting the above voltage to the wiring 326 via the multiple vias 324, resistance can be reduced, and hence a voltage drop caused during the driving of the APD can be reduced. In one embodiment, intervals between the vias 324 are the same, but the vias 324 may be disposed at different intervals.

Figure 17E:
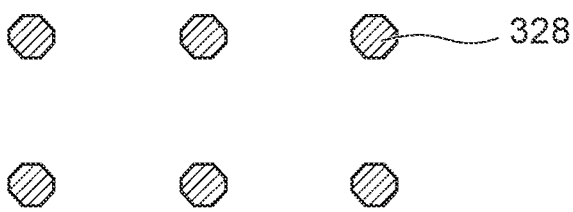

The wiring 326 and the wiring 325 are disposed as illustrated in FIG. 17D. The wiring layer in which the wiring 325 is disposed and the wiring layer in which the wiring 330 is disposed have substantially the same shape when viewed in plan. The wiring layer in which the wiring 326 is disposed may not need to be disposed, but in one embodiment, it is disposed. The wiring layer in which the wiring 328 illustrated in FIG. 17E is disposed is the same wiring layer as the pad electrode 352.

The drive voltage supplied from the pad electrode 352 is in turn supplied to the anode of the APD, as illustrated in the sectional view of FIG. 15, through a wiring disposed in the same wiring layer as the wiring 325.

On that occasion, as illustrated in FIG. 15, a via connecting the pad electrode and the wiring may be disposed at a position deviated from a via in a layer just above the former via toward the pad electrode. With such a configuration, since the number of the vias disposed in the end portion of the pixel array can be increased in comparison with that disposed in an inner portion of the pixel array, a voltage drop from a PAD level during the driving of the APD can be reduced.

In FIG. 16, wiring layers other than the wirings forming the metal bonded portions in the wiring structure 303 are made of aluminum, and the wirings forming the metal bonded portions and the wirings in the wiring structure 403 are made of copper. However, the wiring layers other than the wirings forming the metal bonded portions in the wiring structure 303 may also be made of copper.

According to this embodiment, since the materials and the shapes of the wiring through which the drive voltages for the APD are supplied are selected as described above, the photoelectric conversion apparatus with higher reliability can be provided.

Eighth Embodiment

Figure 18:
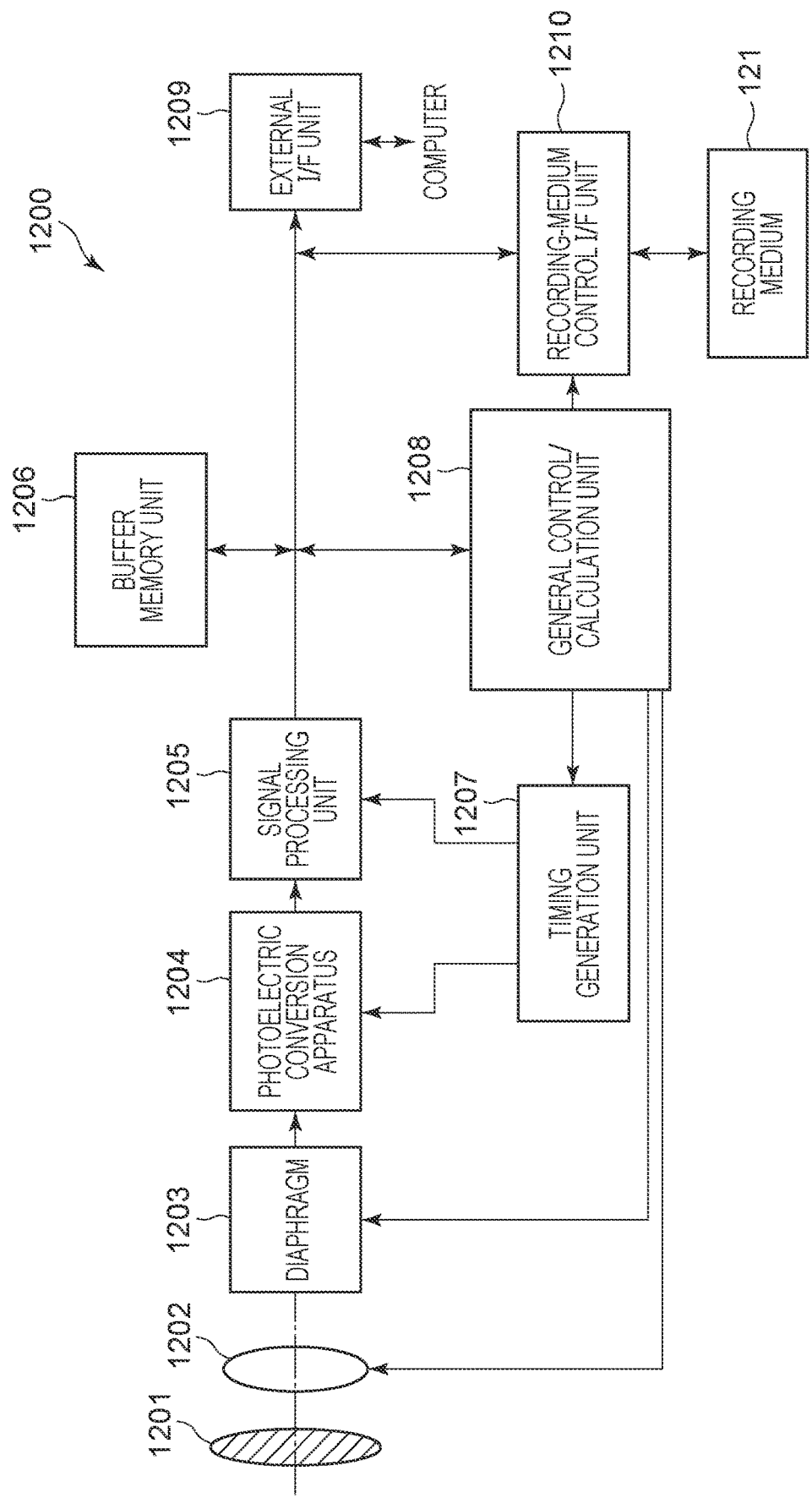
FIG. 18 is a block diagram of an optical detection system according to an eighth embodiment.

FIG. 18 is a block diagram illustrating a configuration of an optical detection system 1200 according to an eighth embodiment.

The optical detection system 1200 according to this embodiment includes a photoelectric conversion apparatus 1204. Here, one of the photoelectric conversion apparatuses according to the above-described embodiments can be applied to the photoelectric conversion apparatus 1204. The optical detection system 1200 can be used as, for example, an imaging system. Practical examples of the imaging system are a digital still camera, a digital camcorder, and a monitoring camera. FIG. 18 illustrates an example in which the optical detection system 1200 is a digital still camera.

The optical detection system 1200 illustrated in FIG. 18 includes the photoelectric conversion apparatus 1204, a lens 1202 for focusing an optical image of an object onto the photoelectric conversion apparatus 1204, a diaphragm 1203 for varying a quantity of light passing through the lens 1202, and a barrier 1201 for protecting the lens 1202. The lens 1202 and the diaphragm 1203 form an optical system for condensing light to the photoelectric conversion apparatus 1204.

The optical detection system 1200 includes a signal processing unit 1205 for processing an output signal output from the photoelectric conversion apparatus 1204. The signal processing unit 1205 executes a signal processing operation of executing various corrections and compressions on an input signal as required and then outputting a signal after the processing. The optical detection system 1200 further includes a buffer memory unit 1206 for temporarily storing image data, and an external interface unit (external I/F unit) 1209 for communicating with, for example, an external computer. In addition, the optical detection system 1200 includes a recording medium 1211, such as a semiconductor memory, on which or from which image data is recorded or read out, and a recording-medium control interface unit (recording-medium control I/F unit) 1210 for recording or reading out image data on or from the recording medium 1211. The recording medium 1211 may be incorporated in the optical detection system 1200 or may be detachably mounted on the same. Communication between the recording-medium control I/F unit 1210 and the recording unit 1211 and communication from the external I/F unit 1209 may be performed wirelessly.

Moreover, the optical detection system 1200 includes a general control/calculation unit 1208 for executing various calculations and controlling the entirety of the digital still camera, and a timing generation unit 1207 for outputting various timing signals to the photoelectric conversion apparatus 1204 and the signal processing unit 1205. Here, the timing signals and so on may be input from the outside, and the optical detection system 1200 is to be included at least the photoelectric conversion apparatus 1204 and the signal processing unit 1205 for processing the output signal from the photoelectric conversion apparatus 1204. The timing generation unit 1207 may be mounted on the photoelectric conversion apparatus. The general control/calculation unit 1208 and the timing generation unit 1207 may be constituted to execute part or all of control functions of the photoelectric conversion apparatus 1204.

The photoelectric conversion apparatus 1204 outputs an image signal to the signal processing unit 1205. The signal processing unit 1205 executes predetermined signal processing on the image signal output from the photoelectric conversion apparatus 1204 and outputs image data. Furthermore, the signal processing unit 1205 forms an image from the image signal. In addition, the signal processing unit 1205 may execute distance measurement calculation on the signal output from the photoelectric conversion apparatus 1204. The signal processing unit 1205 and the timing generation unit 1207 may be mounted on the photoelectric conversion apparatus. In other words, the signal processing unit 1205 and the timing generation unit 1207 may be mounted on a substrate on which pixels are disposed or may be disposed on a different substrate. When the imaging system is constituted by using the photoelectric conversion apparatus according to any of the above-described embodiments, the imaging system capable of providing an image with higher quality can be realized.

Ninth Embodiment

Figure 19:
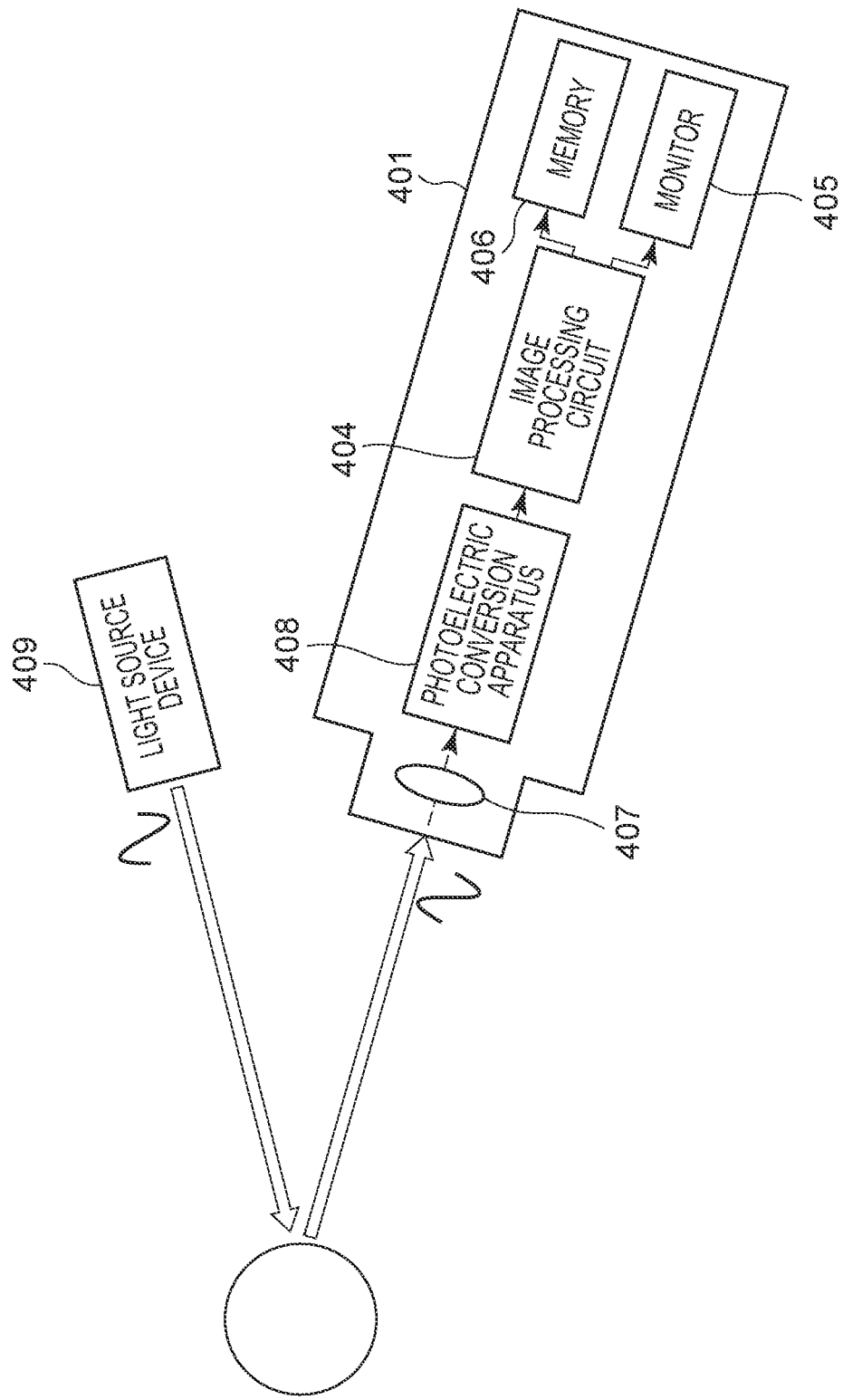
FIG. 19 is a block diagram of an optical detection system according to a ninth embodiment.

FIG. 19 is a block diagram illustrating an exemplary configuration of a distance image sensor 401 that is an electronic device utilizing the photoelectric conversion apparatus according to any of the above-described embodiments.

As illustrated in FIG. 19, the distance image sensor 401 includes an optical system 407, a photoelectric conversion apparatus 408, an image processing circuit 404, a monitor 405, and a memory 406. The distance image sensor 401 can obtain a distance image corresponding to a distance up to an object by receiving light (modulated light or pulse light) that has been emitted to the object from a light source device 409 and that has been reflected by a surface of the object.

The optical system 407 includes one or more lenses, guides image light (incident light) from the object to the photoelectric conversion apparatus 408, and focuses the incident light on a light receiving surface (sensor unit) of the photoelectric conversion apparatus 408.

The photoelectric conversion apparatus according to any of the above-described embodiments is used as the photoelectric conversion apparatus 408, and a distance signal representing a distance to be obtained from a received optical signal output from the photoelectric conversion apparatus 408 is supplied to the image processing circuit 404.

The image processing circuit 404 executes image processing to form a distance image based on the distance signal supplied from the photoelectric conversion apparatus 408. A distance image (image data) obtained with the image processing is supplied to the monitor 405 to be displayed or is supplied to the memory 406 to be stored (recorded).

According to distance image sensor 401 configured as described above, since the above-described photoelectric conversion apparatus is applied to the distance image sensor 401, pixel characteristics are improved, and the distance image can be obtained at higher accuracy, for example.

Tenth Embodiment

The technique according to this disclosure (present technique) can be applied to a variety of products. For example, the technique according to this disclosure may be applied to endoscopic surgery systems.

Figure 20:
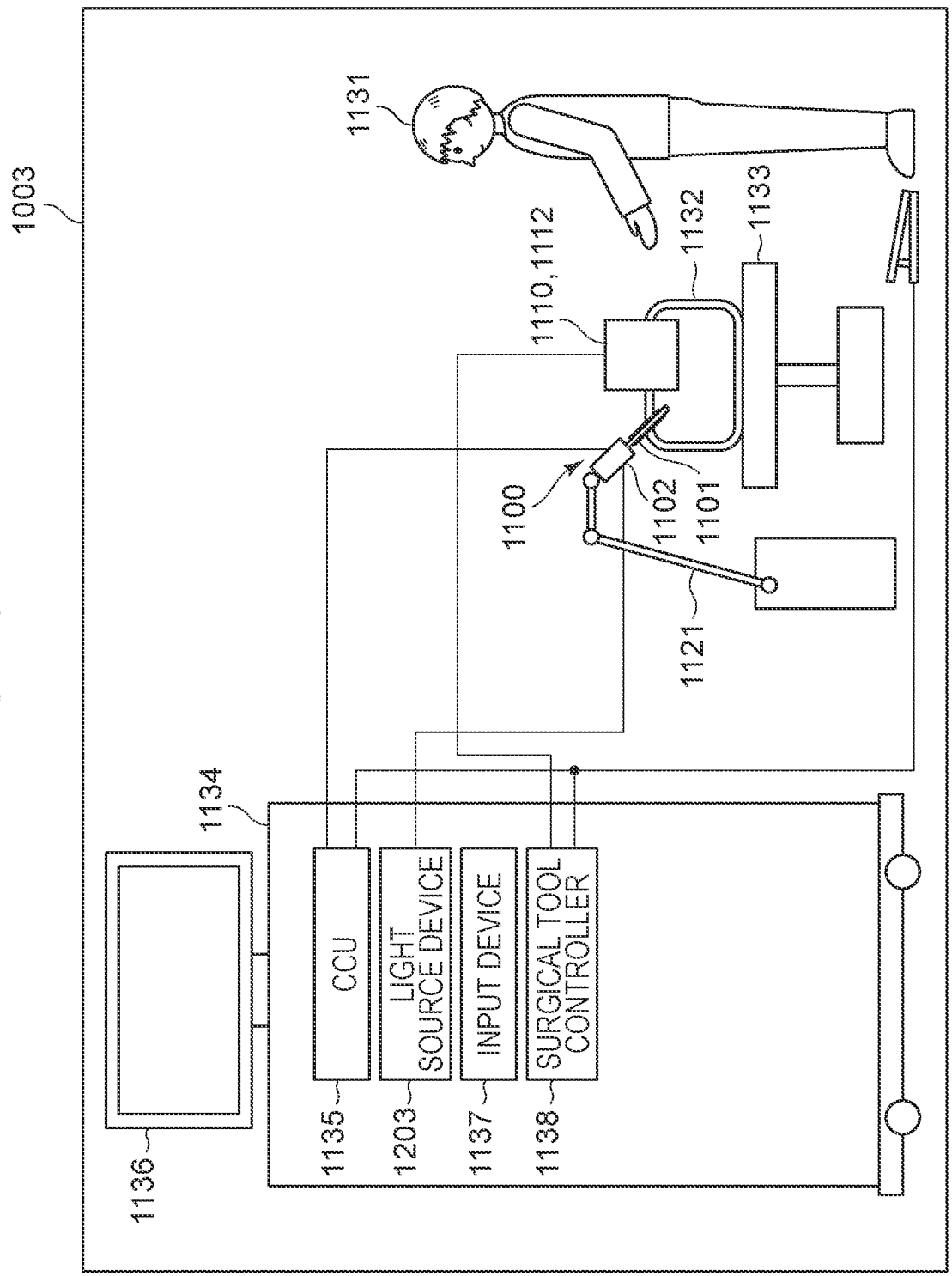
FIG. 20 is a block diagram of an optical detection system according to a tenth embodiment.

FIG. 20 is a schematic view of an exemplary configuration of an endoscopic surgery system 1003 to which the technique according to this disclosure (present technique) can be applied.

FIG. 20 illustrates a situation that a surgeon (doctor) 1131 is performing surgery on a patient 1132 on a patient bed 1133 with the endoscopic surgery system 1003. As illustrated in FIG. 20, the endoscopic surgery system 1003 is constituted by an endoscope 1100, a surgical tool 1110, and a cart 1134 on which various devices for use in the endoscopic surgery are placed.

The endoscope 1100 is constituted by a lens barrel 1101 part of which is inserted into a body cavity of the patient 1132, the part ranging over a predetermined length from a distal end, and a camera head 1102 connected to a base end of the lens barrel 1101. Although the endoscope 1100 including the rigid lens barrel 1101, namely the so-called rigid endoscope, is used in the illustrated example, the endoscope 1100 may be constituted as the so-called soft endoscope including a soft lens barrel.

An opening is formed at the distal end of the lens barrel 1101, and an objective lens is fitted to the opening. A light source device 1203 is connected to the endoscope 1100. Light generated from the light source device 1203 is guided to the distal end of the lens barrel 1101 by a light guide extending through the lens barrel 1101 and is applied to an observation target in the body cavity of the patient 1132 through the objective lens. The endoscope 1100 may be a direct-viewing endoscope, an oblique-viewing endoscope, or a side-viewing endoscope.

The optical system and the photoelectric conversion apparatus are disposed inside the camera head 1102, and light (observation light) reflected from the observation target is condensed onto the photoelectric conversion apparatus through the optical system. The observation light is photoelectrically converted by the photoelectric conversion apparatus, and an electrical signal corresponding to the observation light, namely an image signal corresponding to an image to be observed, is produced. The photoelectric conversion apparatus may be one of the photoelectric conversion apparatuses according to the above-described embodiments. The image signal is sent as RAW data to a camera control unit (CCU) 1135.

The CCU 1135 is constituted by a CPU (Central Processing Unit) a GPU (Graphics Processing Unit), and so on and controls operations of the endoscope 1100 and a display unit 1136 in a supervising manner. Furthermore, the CCU 1135 receives the image signal from the camera head 1102 and executes various types of image processing, such as RAW processing (demosaic processing), on the image signal to display an image based on the image signal.

The display unit 1136 displays, in accordance with control of the CCU 1135, the image based on the image signal that has been subjected to the image processing by the CCU 1135.

The light source device 1203 is constituted by a light source such as an LED (Light Emitting Diode), for example, and applies, to the endoscope 1100, illumination light to take an image of, for example, part under surgery.

An input device 1137 is an input interface for the endoscopic surgery system 1003. A user can input various items of information and various instructions to the endoscopic surgery system 1003 through the input device 1137.

A surgical tool controller 1138 controls driving of an energy tool 1112 to perform, for example, cauterization or incision of tissues and sealing of blood vessels.

The light source device 1203 for applying, to the endoscope 1100, the illumination light to take the image of the part under surgery may be a white light source that is constituted by, for example, an LED, a laser beam source, or a combination of them. When the white light source is constituted by a combination of RGB laser beam sources, white balance of a taken image can be adjusted in the light source device 1203 because output intensity and output timing for each color (each wavelength) can be controlled with high accuracy. Furthermore, in the above case, individual images corresponding to RGB can be taken in time division by applying individual laser beams from the RGB laser beam sources to the observation target and by controlling driving of imaging elements of the camera head 1102 in synchronism with timings of applying the laser beams. Such a method enables a color image to be obtained without disposing a color filter for each of the imaging elements.

Driving of the light source device 1203 may be controlled such that intensity of the light output from the light source device 1203 is changed per predetermined time. A high dynamic range image free from the so-called crushed shadows and blown highlights can be produced by controlling the driving of the imaging elements in the camera head 1102 in synchronism with timing at which the intensity of the above-mentioned output light is changed, thus obtaining images in time division, and then synthesizing those images.

The light source device 1203 may be constituted to be able to supply light in a predetermined wavelength range corresponding to special light observation. The special light observation is performed, for example, by utilizing wavelength dependency of absorption of light in body tissues. In a specific example, an image of a predetermined tissue, such as blood vessels in a surface layer of the mucous membrane, is taken with high contrast by applying light in a narrower range than illumination light (namely, white light) that is used in usual observation.

Alternatively, fluorescence observation for obtaining an image with fluorescence generated upon illumination with excitation light may be performed in the special light observation. In the fluorescence observation, it is possible, for example, to perform an operation of applying excitation light to a body tissue and observing fluorescence from the body tissue, or an operation of locally injecting a reagent, such as indocyanine green (ICG), to a body tissue, applying excitation light adapted for a fluorescence wavelength of the reagent to the body tissue, and obtaining a fluorescence image. The light source device 1203 can be constituted to be able to supply the narrow-range light and/or the excitation light adapted for the above-described special light observation.

Eleventh Embodiment

Figure 21A:
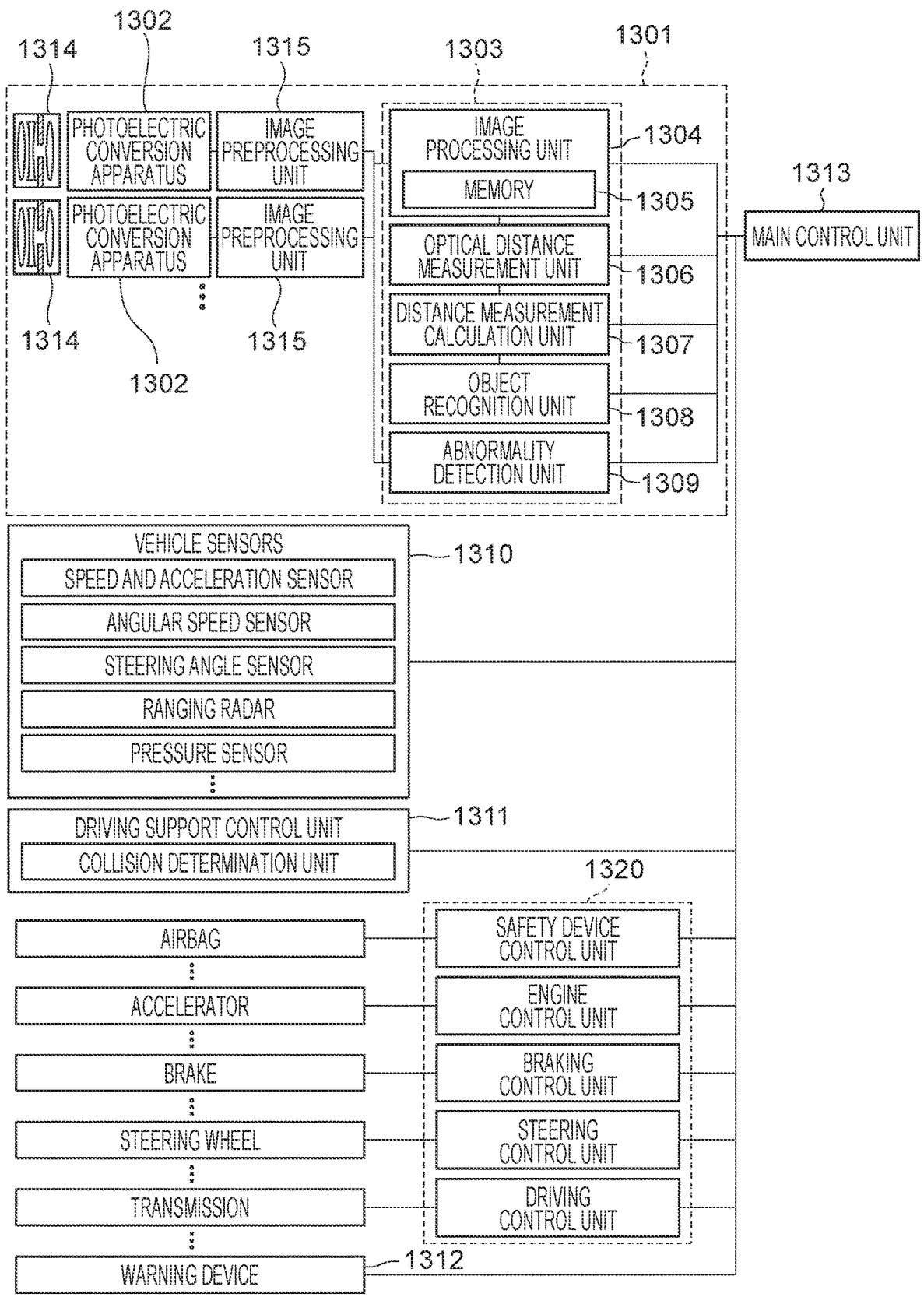
Figure 22:
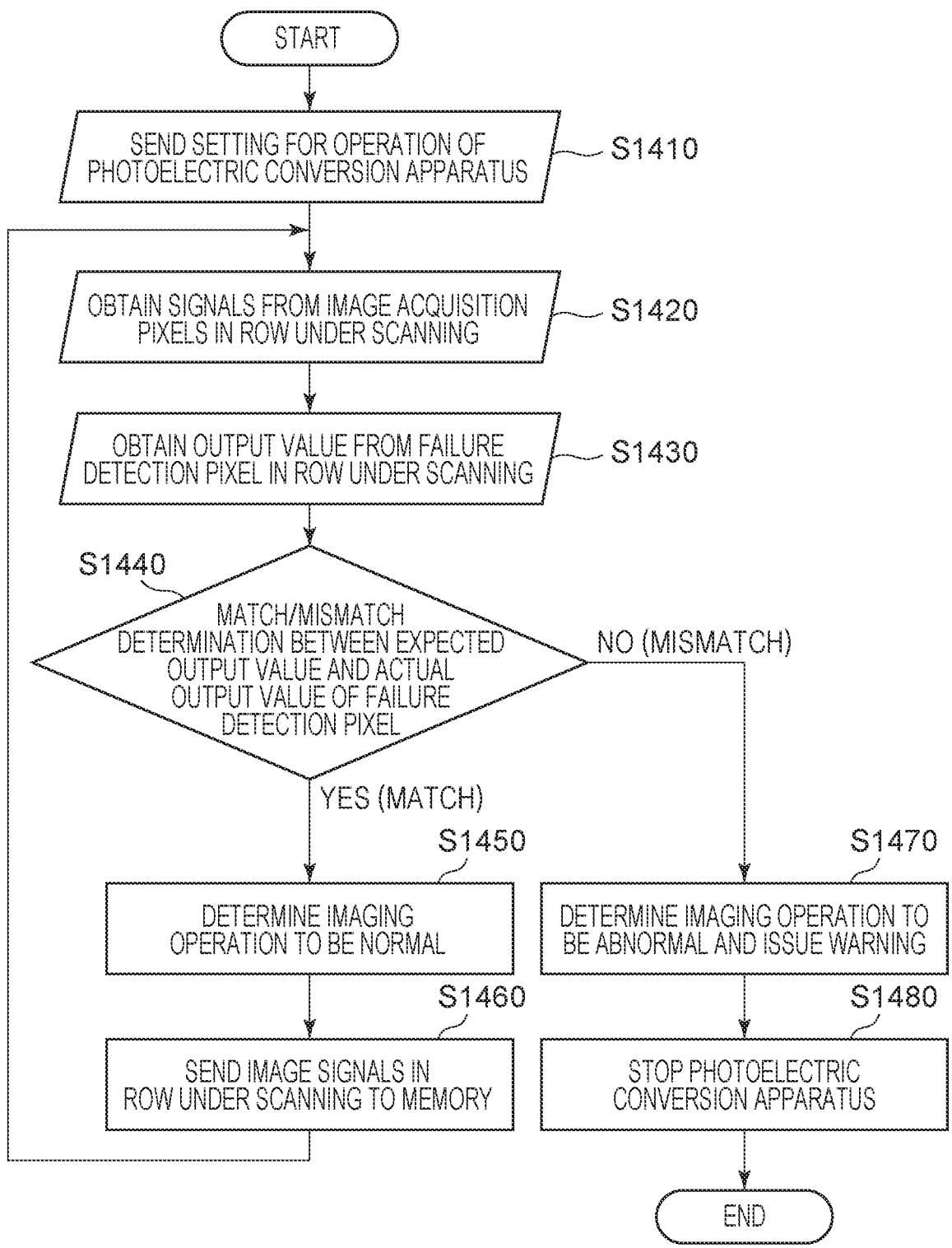
FIG. 22 is a flowchart for the optical detection system according to the eleventh embodiment.

An optical detection system and a moving body according to an eleventh embodiment will be described below with reference to FIGS. 21A, 21B, and 22. FIG. 21A is a block diagram illustrating an exemplary configuration of the optical detection system and the moving body according to this embodiment. FIG. 22 is a flowchart representing operation of the optical detection system according to this embodiment. In this embodiment, the optical detection system is described in connection with an example of an on-vehicle camera.

FIGS. 21A and 21B illustrate an example of a vehicle system and an optical detection system 1301 that is mounted on the vehicle system to take an image. The optical detection system 1301 includes a photoelectric conversion apparatus 1302, an image pre-processing unit 1315, an integrated circuit 1303, and an optical system 1314. The optical system 1314 focuses an optical image of an object on the photoelectric conversion apparatus 1302. The photoelectric conversion apparatus 1302 converts the optical image of the object, focused by the optical system 1314, to an electrical signal. The photoelectric conversion apparatus 1302 is one of the photoelectric conversion apparatuses according to the above-described embodiments. The image pre-processing unit 1315 executes predetermined signal processing on a signal output from the photoelectric conversion apparatus 1302. The function of the image pre-processing unit 1315 may be incorporated in the photoelectric conversion apparatus 1302. The optical detection system 1301 includes at least two sets of the optical systems 1314, the photoelectric conversion apparatuses 1302, and the image pre-processing units 1315. An output from the image pre-processing unit 1315 in each set is input to the integrated circuit 1303.

The integrated circuit 1303 is an integrated circuit designed for an imaging system and includes an image processing unit 1304 equipped with a memory 1305, an optical distance measuring unit 1306, a distance measurement calculation unit 1307, an object recognition unit 1308, and an abnormality detection unit 1309. The image processing unit 1304 executes image processing, such as RAW processing and defect correction, on an output signal from the image pre-processing unit 1315. The memory 1305 serves as a primary storage for the taken image and further stores defect positions of pixels in the taken image. The optical distance measuring unit 1306 performs focusing on the object and distance measurement. The distance measurement calculation unit 1307 calculates measured distance information from multiple sets of image data obtained from the multiple photoelectric conversion apparatuses 1302. The object recognition unit 1308 recognizes objects such as vehicles, roads, traffic signs, and persons. The abnormality detection unit 1309 issues, upon detection of an abnormality in any of the photoelectric conversion apparatuses 1302, a notice indicating the occurrence of the abnormality to a main control unit 1313.

The integrated circuit 1303 may be realized with hardware designed for dedicated use, software modules, or a combination of them. Alternatively, the integrated circuit 1303 may be realized with, for example, FPGA (Field Programmable Gate Array), ASIC (Application Specific Integrated Circuit), or a combination of them.

The main control unit 1313 supervises and controls operations of the optical detection system 1301, vehicle sensors 1310, control units 1320, and so on. As another method, the optical detection system 1301, the vehicle sensors 1310, and the control units 1320 may have individual communication interfaces without using the main control unit 1313, and control signals may be sent and received via a communication network (in accordance with, for example, the CAN (Controller Area Network) standards).

The integrated circuit 1303 has a function of sending control signals and setting values to the photoelectric conversion apparatuses 1302 upon receiving control signals from the main control unit 1313 or under control of a control unit incorporated therein.

The optical detection system 1301 is connected to the vehicle sensors 1310 to be able to detect driving conditions of the vehicle, such as a vehicle speed, a yaw rate, and a steering angle, environments outside the vehicle, and conditions of other vehicles and obstacles. The vehicle sensors 1310 also serve as a distance information acquisition unit for obtaining distance information up to the object. Furthermore, the optical detection system 1301 is connected to a driving support control unit 1311 for providing various driving supports such as automatic steering, automatic cruising, and a collision avoidance function. Regarding the collision avoidance function, estimation of collision and the occurrence of collision with another vehicle or any obstacle are determined based on the detection results of the optical detection system 1301 and the vehicle sensors 1310. In accordance with the determination, the optical detection system 1301 performs avoidance control when the collision is estimated and activation of a safety device in case of the collision.

The optical detection system 1301 is further connected to a warning device 1312 that issues warnings to a driver based on the determination result of a collision determination unit. For example, when the determination result of the collision determination unit indicates high possibility of the collision, the main control unit 1313 performs vehicle control for avoiding the collision or reducing damage by, for example, braking the vehicle, retracting an accelerator, and/or reducing an engine output. The warning device 1312 issues warnings to the user by, for example, giving an alarm such as a sound, displaying alarm information on a display screen of a car navigation system or a meter panel, and/or vibrating a sheet belt or a steering wheel.

In this embodiment, the optical detection system 1301 takes an image of the surrounding of the vehicle, for example, the front or the back of the vehicle. FIG. 21B illustrates a layout example of the optical detection system 1301 when the image of the front of the vehicle is taken by the optical detection system 1301.

Two photoelectric conversion apparatuses 1302 are disposed in front of a vehicle 1300. In a specific example, when a vehicular center line when viewed in a traveling direction of the vehicle 1300 or with respect to an outline (for example, a vehicle width) of the vehicle 1300 is regarded as a symmetric axis, the two photoelectric conversion apparatuses 1302 are disposed in line symmetry relative to the symmetry axis. That layout is desired in obtaining the information of the distance between the vehicle 1300 and the object of which image is to be taken, and in determining a possibility of the collision. Furthermore, in one embodiment, the photoelectric conversion apparatuses 1302 are disposed at positions not interfering with the visual field of a driver when the driver visually recognizes situations outside the vehicle 1300 from a driver's seat. The warning device 1312 is disposed at a position reliably falling within the visual field of the driver.

A failure detection operation of the photoelectric conversion apparatus 1302 in the optical detection system 1301 will be described below with reference to FIG. 22. The failure detection operation of the photoelectric conversion apparatus 1302 is performed in accordance with steps S1410 to S1480 illustrated in FIG. 22.

In step S1410, the setting at startup of the photoelectric conversion apparatus 1302 is performed. In more detail, the setting for the operation of the photoelectric conversion apparatus 1302 is sent from the outside (for example, the main control unit 1313) or the inside of the optical detection system 1301 to start the imaging operation and the failure detection operation of the photoelectric conversion apparatus 1302.

Next, in step S1420, pixel signals are obtained from the effective pixels. Furthermore, in step S1430, an output value from a failure detection pixel disposed for detecting a failure is obtained. The failure detection pixel includes a photoelectric conversion element as in the effective pixel. A predetermined voltage is written in the photoelectric conversion element of the failure detection pixel. The failure detection pixel outputs a signal corresponding to the voltage written into the photoelectric conversion element. The order of step S1420 and step S1430 may be reversed.

Next, in step S1440, match/mismatch determination between an expected output value from the failure detection pixel and an actual output value from the failure detection pixel is executed. If a result of the match/mismatch determination in step S1440 indicates that the expected output value and the actual output value match, the processing step shifts to step S1450 where it is determined that the imaging operation is normally performed. Then, the processing step shifts to step S1460. In step S1460, the pixel signals from a row under scanning are sent to the memory 1305 for primary storage. Thereafter, the processing step returns to step S1420 to continue the failure detection operation. On the other hand, if a result of the match/mismatch determination in step S1440 indicates that the expected output value and the actual output value mismatch, the processing step shifts to step S1470. In step S1470, the imaging operation is determined to be abnormal, and a warning notification is informed to the main control unit 1313 or the warning device 1312. The warning device 1312 causes the display unit to display information indicating the detection of abnormality. Then, the photoelectric conversion apparatus 1302 is stopped in step S1480, and the operation of the optical detection system 1301 is ended.

Although the above embodiment has been described in connection with an example of looping the flowchart per row, the flowchart may be looped per multiple rows, or the failure detection operation may be executed per frame. The warning issued in step S1470 may be notified to the outside of the vehicle via a wireless network.

Although the above embodiment has been described in connection with the control of avoiding the collision with another vehicle, the optical detection system 1301 can also be applied to control for automatic operation following another vehicle or control for automatic operation keeping the vehicle from not going out of the lane. Without being limited to vehicles such as cars, the optical detection system 1301 can be further applied to other moving bodies (moving apparatuses) such as ships, aircrafts, and industrial robots, for example. In addition, the optical detection system 1301 can be applied to a variety of equipment utilizing recognition of objects, such as an intelligent traffic system (ITS), without being limited to the moving bodies.

Moreover, the photoelectric conversion apparatus according to the present disclosure may be constituted to be able to obtain various items of information including distance information, for example.

Twelfth Embodiment

Figure 23A:
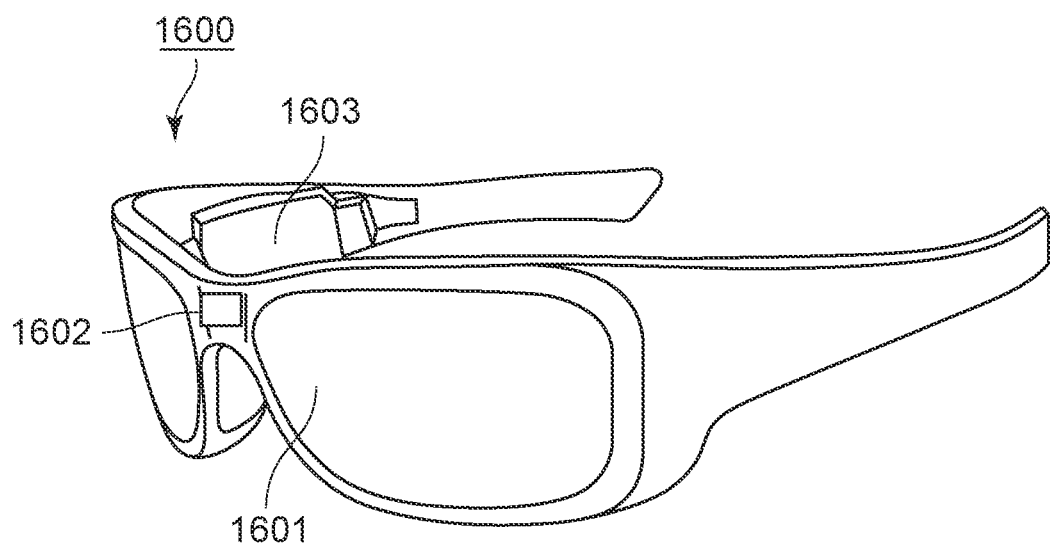
FIGS. 23A and 23B each illustrate a specific example of an electronic apparatus according to a twelfth embodiment.

FIG. 23A illustrates a pair of eyeglasses 1600 (smart glasses) according to one application example of a twelfth embodiment. The pair of eyeglasses 1600 includes a photoelectric conversion apparatus 1602. The photoelectric conversion apparatus 1602 is one of the photoelectric conversion apparatuses according to the above-described embodiments. A display device including a light emitting device, such as an OLED or an LED, may be attached to a rear surface side of each lens 1601. One or more photoelectric conversion apparatuses 1602 may be disposed. Multiple types if photoelectric conversion apparatuses may be combined with each other. A layout position of the photoelectric conversion apparatus 1602 is not limited to the position illustrated in FIG. 23A.

The pair of eyeglasses 1600 further includes a control device 1603. The control device 1603 functions as a power supply for supplying electric power to the photoelectric conversion apparatus 1602 and the above-mentioned display device. Furthermore, the control device 1603 controls operations of the photoelectric conversion apparatus 1602 and the display device. An optical system for condensing light to the photoelectric conversion apparatus 1602 is formed on the lens 1601.

Figure 23B:
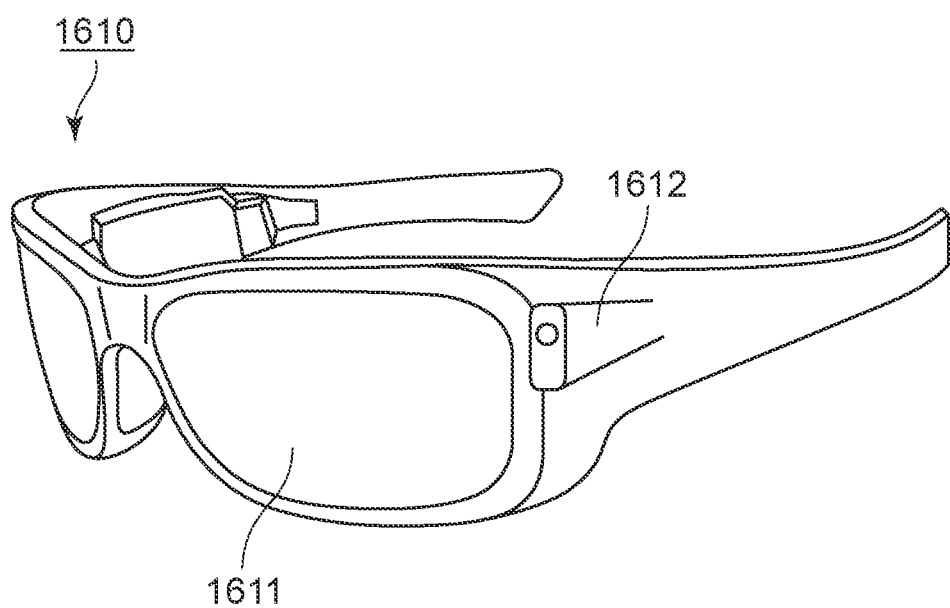

FIG. 23B illustrates a pair of eyeglasses 1610 (smart glasses) according to another application example of the twelfth embodiment. The pair of eyeglasses 1610 includes a control device 1612 on which a photoelectric conversion apparatus corresponding to the photoelectric conversion apparatus 1602 and a display device are mounted. An optical system for projecting lights emitted from both the photoelectric conversion apparatus and the display device disposed in the control device 1612 is formed on each lens 1611, and an image is projected on the lens 1611. The control device 1612 not only functions as a power supply for supplying electric power to the photoelectric conversion apparatus and the display device, but also controls operations of the photoelectric conversion apparatus and the display device. The control device may include a line-of-sight detection unit for detecting the line of sight of a wearer. Infrared light may be used to detect the line of the sight. An infrared light emitting unit emits infrared light to an eyeball of a user looking at a display image. An image of the eyeball is obtained by an imaging unit detecting reflected light of the emitted infrared light from the eyeball, the imaging unit including a light receiving element. A reduction in quality of the image is reduced with the provision of a unit for reducing light that enters the display device from the infrared light emitting unit when viewed in plan.

The line of sight of the user for the display image is detected from the eyeball image obtained with the above-described infrared imaging. A suitable one of known methods can be used to detect the line of sight from the eyeball image. For example, a line-of-sight detection method based on a Purkinje image formed by reflection of illuminated light at the cornea can be used.

In more detail, a line-of-sight detection process based on a pupil and corneal reflection method is performed. The line of sight of the user is detected by detecting a line-of-sight vector representing a direction (rotation angle) of the eyeball in accordance with the pupil and corneal reflection method based on an image of the pupil and the Purkinje image that are included in the obtained eyeball image.

The display device in this embodiment may include a photoelectric conversion apparatus including a light receiving element and may control an image displayed on the display device in accordance with line-of-sight information of the user given from the photoelectric conversion apparatus.

In more detail, for the display device, a first visual field region at which the user is looking and a second visual field region other than the first visual field region are determined based on the line-of-sight information. The first visual field region and the second visual field region may be determined by a control device in the display device, or those regions determined by an external control device may be received from the external control device. Of a display region of the display device, a display resolution in the first visual field region may be controlled to be higher than that in the second visual field region. In other words, a display resolution in the second visual field region may be controlled to be lower than that in the first visual field region.

Alternatively, the display region may include a first display region and a second display region different from the first display region, and which one of the first display region and the second display region is to be given with higher priority may be determined based on the line-of-sight information. The first display region and the second display region may be determined by the control device in the display device, or those regions determined by an external control device may be received from the external control device. A resolution in a region with higher priority may be controlled to be higher than that in a region other than the region with the higher priority. In other words, a resolution in the region with relatively low priority may be set to be relatively low.

An AI program may be used to determine the first visual field region and the region with higher priority. The AI program may be a model that is designed to use, as teacher data, an eyeball image and an actually viewing direction of an eyeball in the image, and to estimate an angle of the line of sight and a distance up to an object ahead of the line of sight from the eyeball image. The AI program may be installed in the display device, the photoelectric conversion apparatus, or an external device. When the AI program is installed in the external device, it is transmitted to the display device via communication.

When display control is to be performed based on visual recognition and detection, the aspect of the embodiment is applied to smart glasses that further include a photoelectric conversion apparatus for imaging the outside. The smart glasses can display external information obtained by imaging the outside in real time.

Other Embodiments

Although the embodiments have been described above, the present disclosure is not limited to those embodiments, and various alterations and modifications can be made on the embodiments. In addition, the features of the embodiments can be optionally applied to each other.

According to the present disclosure, the photoelectric conversion apparatus can be obtained in which, regarding a first wiring for supplying a drive voltage to one of two nodes of the APD and a second wiring for supplying a drive voltage to the other node, concrete configurations and layout positions are designed in consideration of the withstand voltage between the first wiring and the second wiring.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-008442 filed Jan. 22, 2021, which is hereby incorporated by reference herein in its entirety.

What is claimed is:

1. An apparatus comprising:
a layer having a light incident surface and including conversion elements; and
a wiring structure disposed on a surface of the layer on an opposite side to the light incident surface,
wherein each of the conversion elements includes a photodiode,
the photodiode includes a first region of a first conductivity type in which charges having same polarity as signal carriers are majority carriers, a second region of a second conductivity type and a region of the second conductivity type,
a first voltage is supplied to the second region through the region of the second conductivity type,
the wiring structure includes a first wiring, among wirings, positioned closest to the layer to supply the first voltage to the region of the second conductivity type, a plug arranged to connect the first wiring and the region of the second conductivity type, and a second wiring arranged to supply a second voltage to the first region,
the second wiring is disposed to cover the first region of the first conductivity type when viewed in plan view, and
a distance between the second wiring and the layer is shorter than a distance between the first wiring and the layer.

2. An apparatus comprising:
a layer having a light incident surface and including conversion elements; and
a wiring structure disposed on a surface of the layer on an opposite side to the light incident surface,
wherein each of the conversion elements includes a photodiode,
the photodiode includes a first region of a first conductivity type in which charges having same polarity as signal carriers are majority carriers and a second region of a second conductivity type,
a first voltage is supplied to the second region through a region of the second conductivity type,
the wiring structure includes a first wiring, among wirings, positioned closest to the layer to supply the first voltage to the region of the second conductivity type, a plug arranged to connect the first wiring and the region of the second conductivity type, and a second wiring disposed to overlap the first region of the first conductivity type when viewed in plan view,
the second wiring is disposed to cover the first region when viewed in plan view,
a distance between the second wiring and the layer is shorter than a distance between the first wiring and the layer,
when viewed in plan view, a first conversion element among the conversion elements and a second conversion element among the conversion elements are disposed side by side in a first direction, and a third conversion element among the conversion elements and the second conversion element among the conversion elements are disposed side by side in a second direction intersecting the first direction, and
when viewed in plan view, the second wiring overlapping the first region of the first conversion element when viewed in plan view and the second wiring overlapping the first region of the second conversion element are disposed adjacent to each other in the first direction, and the first wiring is not disposed between the second wiring for the first conversion element when viewed in plan view and the second wiring for the second conversion element.

3. The apparatus according to claim 1, wherein part of the plug is disposed at a same height of the second wiring.

4. The conversion apparatus according to claim 1, wherein the plug is constituted by a first via and a second via, the first via and the second via being stacked.

5. The apparatus according to claim 4, wherein the first via and the second via are made of a same material.

6. The apparatus according to claim 1, wherein the second wiring and the first region of the first conductivity type are connected through a second plug, and
the second plug is disposed at a center of the first region when viewed in plan view.

7. The apparatus according to claim 1, further comprising a second layer including a circuit configured to process a signal output from the photodiode,
wherein the second layer and the layer are laminated.

8. The apparatus according to claim 1, wherein the second wiring is disposed to cover entirety of the first region of the first conductivity type when viewed in plan view.

9. The apparatus according to claim 1, wherein a main component of the second wiring is copper.

10. The apparatus according to claim 1, wherein a main component of the second wiring is aluminum.

11. The apparatus according to claim 1, wherein the first wiring is disposed to cover a gap between the second wiring and the plug when viewed in plan view.

12. The apparatus according to claim 1, wherein an isolation is provided between the conversion elements.

13. The apparatus according to claim 12, wherein the isolation penetrates through the layer.

14. The apparatus according to claim 12, wherein the isolation is filled with metal.

15. The apparatus according to claim 1,
wherein the light incident surface of the layer includes recesses.

16. The apparatus according to claim 1,
wherein the photodiode includes a third region of the first conductivity type, the third region is larger than the first region when viewed in plan view, and signal carriers generated in the third region are collected into the first region.

17. The apparatus according to claim 1,
wherein the second wiring is disposed to overlap the region of the second conductivity type when viewed in plan view.

18. An apparatus comprising:
a layer having a light incident surface and including conversion elements configured to include photodiodes; and
a wiring structure disposed on a surface of the layer on an opposite side to the light incident surface,
wherein each of the photodiodes includes a first region of a first conductivity type in which charges having same polarity as signal carriers are majority carriers and a second region of a second conductivity type,
a first voltage is supplied to the second region through a region of the second conductivity type,
the wiring structure includes a first wiring arranged to supply the first voltage to the region of the second conductivity type and positioned closest to the layer, and a second wiring disposed in same wiring layer as the first wiring and arranged to supply a second voltage to the first region,
the first wiring has an opening,
the second wiring is disposed in the opening of the first wiring when viewed in plan view,
the second wiring is defined by five or more sides when viewed in plan view, and
the opening of the first wiring has five or more sides.

19. The apparatus according to claim 18,
wherein number of the sides of the opening of the first wiring is equal to number of the sides of the second wiring.

20. The apparatus according to claim 18,
wherein the second wiring is defined by eight sides when viewed in plan view.

21. A system comprising:
the apparatus according to claim 1, and
a processing unit configured to process a signal output from the apparatus.

22. A moving body comprising:
the apparatus according to claim 1, and
an acquisition unit configured to obtain distance information up to an object based on measured distance information in accordance with a signal from the apparatus,
wherein the moving body further includes a control unit configured to control the moving body based on the distance information.

* * * * *